US011879917B2

(12) United States Patent
Hirai et al.

(10) Patent No.: US 11,879,917 B2
(45) Date of Patent: Jan. 23, 2024

(54) PHASE DETECTOR

(71) Applicant: Mitsubishi Electric Corporation, Tokyo (JP)

(72) Inventors: Akihito Hirai, Tokyo (JP); Masaomi Tsuru, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 229 days.

(21) Appl. No.: 17/554,464

(22) Filed: Dec. 17, 2021

(65) Prior Publication Data
US 2022/0107347 A1   Apr. 7, 2022

Related U.S. Application Data
(63) Continuation of application No. PCT/JP2019/030757, filed on Aug. 5, 2019.

(51) Int. Cl.
*G01R 25/00* (2006.01)
*H03H 11/16* (2006.01)
*H03H 11/04* (2006.01)

(52) U.S. Cl.
CPC ............ *G01R 25/00* (2013.01); *H03H 11/04* (2013.01); *H03H 11/16* (2013.01)

(58) Field of Classification Search
CPC ........ H03H 11/00; H03H 11/02; H03H 11/04; H03H 11/16; H03D 13/00; H03D 13/007; H03D 13/008; G01R 25/00; G01R 25/005
See application file for complete search history.

(56) References Cited

U.S. PATENT DOCUMENTS 3,573,636 A * 4/1971 Lammers ............... G01R 25/00
327/2
4,520,321 A * 5/1985 Nakatsugawa ........ G01R 25/00
331/25
(Continued)

OTHER PUBLICATIONS

Yazdi et al., "A Precise 360° -Range Phase Detector for f dNIRS Application Using a Pair of XNORs", 2015 IEEE 58th International Midwest Symposium on Circuits and Systems, Aug. 2-5, 2015, total 4 pages.

*Primary Examiner* — Huy Q Phan
*Assistant Examiner* — David B Frederiksen
(74) *Attorney, Agent, or Firm* — Birch, Stewart, Kolasch & Birch, LLP

(57) ABSTRACT

A phase detector includes: a phase shift circuit to phase-shift a first positive-phase signal included in a first differential signal and a first negative-phase signal included in the first differential signal, and phase-shift a second positive-phase signal included in a second differential signal and a second negative-phase signal included in the second differential signal; a multiplication circuit to perform multiplication of two signals for all combinations of the first positive-phase signal and the first negative-phase signal with the phase-shifted second positive-phase signal and the phase-shifted second negative-phase signal, and perform multiplication of two signals for all combinations of the phase-shifted first positive-phase signal and the phase-shifted first negative-phase signal with the second positive-phase signal and the second negative-phase signal; and a phase difference calculating circuit to calculate a phase difference between the first differential signal and the second differential signal using multiplication signals of the multiplication circuit.

10 Claims, 13 Drawing Sheets

(56) References Cited

U.S. PATENT DOCUMENTS

| | | | | |
|---|---|---|---|---|
| 6,888,379 B2* | 5/2005 | Takeo | ................... | H04L 7/0331 |
| | | | | 327/2 |
| 7,152,008 B2* | 12/2006 | Zumkehr | ............... | G01R 25/00 |
| | | | | 702/74 |
| 8,907,702 B1* | 12/2014 | Solomko | .............. | H03D 13/008 |
| | | | | 327/3 |
| 2004/0096024 A1* | 5/2004 | Uchino | .................. | G01R 25/00 |
| | | | | 375/375 |

* cited by examiner

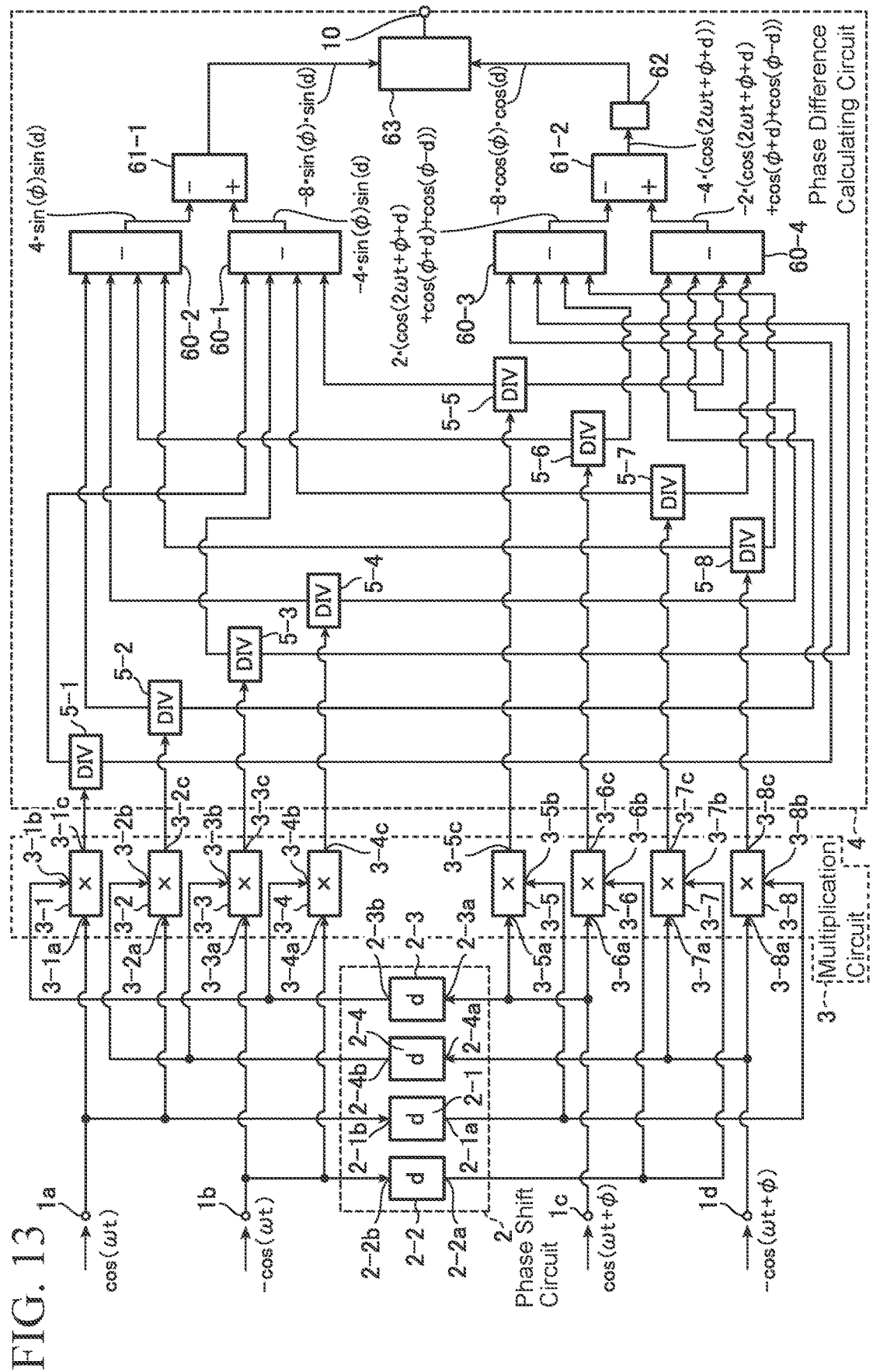

PHASE DETECTOR

CROSS REFERENCE TO RELATED APPLICATIONS

This application is a Continuation of PCT International Application No. PCT/JP2019/030757 filed on Aug. 5, 2019, which is hereby expressly incorporated by reference into the present application.

TECHNICAL FIELD

The present invention relates to a phase detector that calculates a phase difference between a first differential signal and a second differential signal.

BACKGROUND ART

Non-Patent Literature 1 below discloses a phase detector that detects a phase difference $\varphi$ between two signals using a multiplier. The multiplier included in the phase detector multiplies two signals and outputs a multiplication signal indicating a multiplication result of the two signals. When the frequencies of the two signals are equal to each other, a DC component included in the multiplication signal output from the multiplier is a DC voltage proportional to $\cos \varphi$ that is a cosine of a phase difference $\varphi$ between the two signals.

CITATION LIST

Non-Patent Literature

Non-Patent Literature 1: A Precise 360°-Range Phase Detector for fdNIRS Application Using a Pair of XNORs

SUMMARY OF INVENTION

Technical Problem

In the phase detector disclosed in Non-Patent Literature 1, when the frequencies of two signals are equal to each other, a DC component included in the multiplication signal output from the multiplier is a DC voltage proportional to $\cos \varphi$. A value of the DC voltage proportional to $\cos \varphi$ when a phase difference $\varphi$ between two signals is in a range of 0 degrees to 180 degrees is the same as a value of the DC voltage proportional to $\cos \varphi$ when the phase difference $\varphi$ is in a range of 180 degrees to 360 degrees.

Therefore, a range in which the phase detector disclosed in Non-Patent Literature 1 can detect the phase difference $\varphi$ between two signals is limited to the range of 180 degrees disadvantageously.

The present invention has been made in order to solve the above problems, and an object thereof is to obtain a phase detector capable of calculating a phase difference between a first differential signal and a second differential signal without limiting a detection range of a phase difference to a range of 180 degrees.

Solution to Problem

A phase detector according to the present invention includes: a phase shift circuit to phase-shift each of a first positive-phase signal included in a first differential signal and a first negative-phase signal included in the first differential signal, and phase-shift each of a second positive-phase signal included in a second differential signal and a second negative-phase signal included in the second differential signal; a multiplication circuit to perform multiplication of two signals for all combinations of the first positive-phase signal included in the first differential signal and the first negative-phase signal included in the first differential signal with the second positive-phase signal phase-shifted by the phase shift circuit and the second negative-phase signal phase-shifted by the phase shift circuit, output a multiplication signal indicating a result of the multiplication, perform multiplication of two signals for all combinations of the first positive-phase signal phase-shifted by the phase shift circuit and the first negative-phase signal phase-shifted by the phase shift circuit with the second positive-phase signal included in the second differential signal and the second negative-phase signal included in the second differential signal, and output a multiplication signal indicating a result of the multiplication; and a phase difference calculating circuit to calculate a phase difference between the first differential signal and the second differential signal using all the multiplication signals output from the multiplication circuit.

Advantageous Effects of Invention

According to the present invention, a phase difference between a first differential signal and a second differential signal can be calculated without limiting a detection range of the phase difference to a range of 180 degrees.

BRIEF DESCRIPTION OF DRAWINGS

FIG. 13 is a configuration diagram illustrating a phase detector according to a sixth embodiment.

DESCRIPTION OF EMBODIMENTS

Hereinafter, in order to describe the present invention in more detail, embodiment for carrying out the present invention will be described with reference to the accompanying drawings.

First Embodiment

Figure 1:
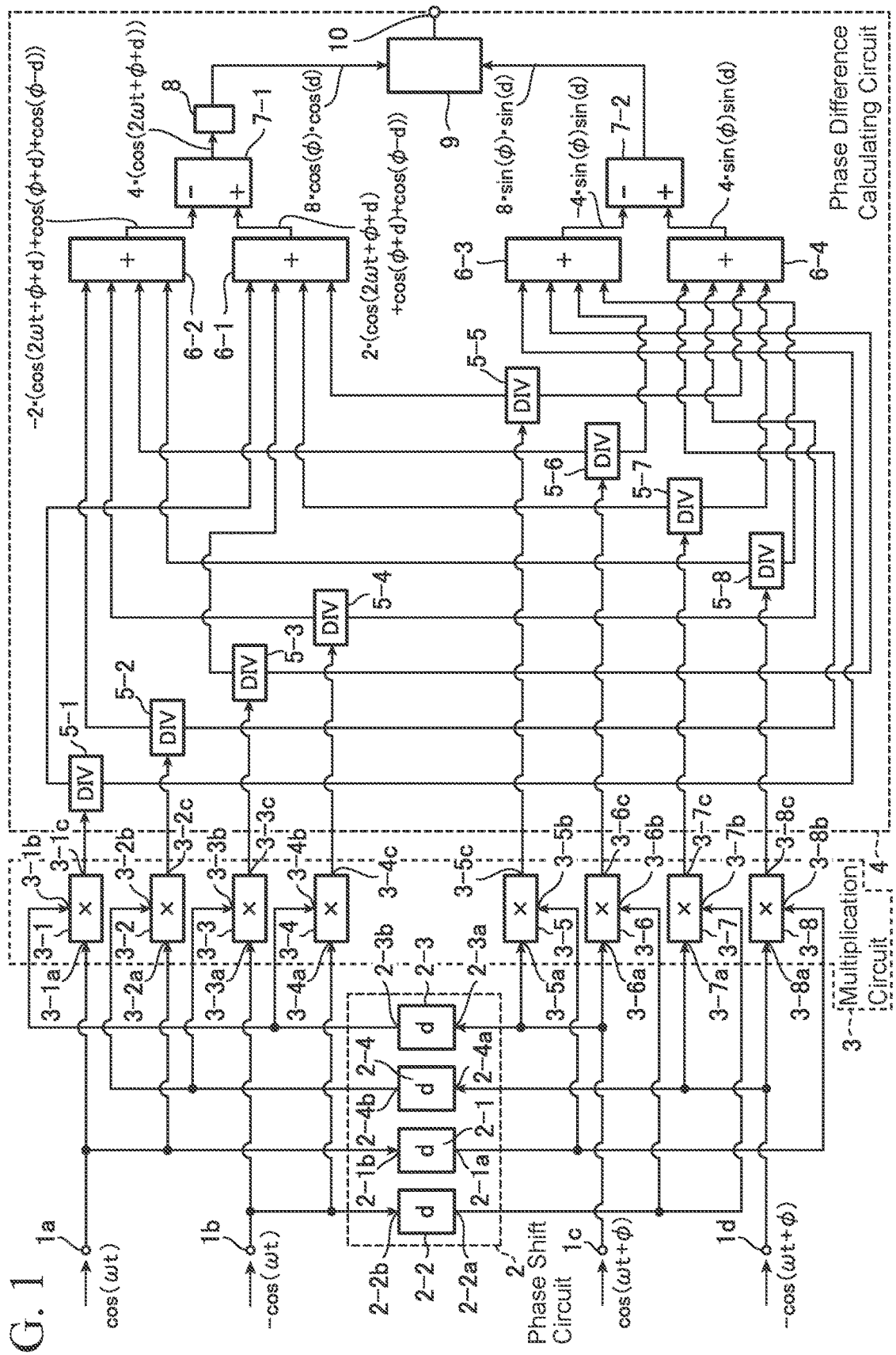
FIG. 1 is a configuration diagram illustrating a phase detector according to a first embodiment.

FIG. 1 is a configuration diagram illustrating a phase detector according to a first embodiment.

In FIG. 1, a signal input terminal 1a is a terminal for inputting $\cos(\omega t)$ as a first positive-phase signal included in a first differential signal that is a radio frequency signal. $\omega$ represents an angular frequency, and t represents time.

A signal input terminal 1b is a terminal for inputting $-\cos(\omega t)$ as a first negative-phase signal included in the first differential signal.

A signal input terminal 1c is a terminal for inputting $\cos(\omega t+\varphi)$ as a second positive-phase signal included in a second differential signal that is a radio frequency signal.

A signal input terminal 1d is a terminal for inputting $-\cos(\omega t+\varphi)$ as a second negative-phase signal included in the second differential signal.

$\varphi$ represents a phase difference between the first positive-phase signal $\cos(\omega t)$ and the second positive-phase signal $\cos(\omega t+\varphi)$, and represents a phase difference between the first negative-phase signal $-\cos(\omega t)$ and the second negative-phase signal $-\cos(\omega t+\varphi)$.

A phase shift circuit 2 includes a phase shifter 2-1, a phase shifter 2-2, a phase shifter 2-3, and a phase shifter 2-4. In FIG. 1, each of the phase shifter 2-1, the phase shifter 2-2, the phase shifter 2-3, and the phase shifter 2-4 is represented by "d".

The phase shift circuit 2 phase-shifts each of the first positive-phase signal $\cos(\omega t)$, the first negative-phase signal $-\cos(\omega t)$, the second positive-phase signal $\cos(\omega t+p)$, and the second negative-phase signal $-\cos(\omega t+p)$ by a phase shift amount d. The phase shift amount d may be stored in an internal memory of the phase shift circuit 2, or may be provided from the outside of the phase detector illustrated in FIG. 1.

The phase shift circuit 2 outputs each of a phase-shifted first positive-phase signal $\cos(\omega t+d)$, a phase-shifted first negative-phase signal $-\cos(\omega t+d)$, a phase-shifted second positive-phase signal $\cos(\omega t+\varphi+d)$, and a phase-shifted second negative-phase signal $-\cos(\omega t+\varphi+d)$ to a multiplication circuit 3 described later.

An input terminal 2-1a of the phase shifter 2-1 is connected to a signal input terminal 1a, and an output terminal 2-1b of the phase shifter 2-1 is connected to each of an input terminal 3-5b of a fifth multiplier 3-5 described later and an input terminal 3-8b of an eighth multiplier 3-8 described later.

When the first positive-phase signal $\cos(\omega t)$ input from the signal input terminal 1a is input from the input terminal 2-1a to the phase shifter 2-1, the phase shifter 2-1 phase-shifts the first positive-phase signal $\cos(\omega t)$ by the phase shift amount d, and outputs the phase-shifted first positive-phase signal $\cos(\omega t+d)$ to each of the fifth multiplier 3-5 and the eighth multiplier 3-8 from the output terminal 2-1b.

An input terminal 2-2a of the phase shifter 2-2 is connected to a signal input terminal 1b, and an output terminal 2-2b of the phase shifter 2-2 is connected to each of an input terminal 3-6b of a sixth multiplier 3-6 described later and an input terminal 3-7b of a seventh multiplier 3-7 described later.

When the first negative-phase signal $-\cos(\omega t)$ input from the signal input terminal 1b is input from the input terminal 2-2a to the phase shifter 2-2, the phase shifter 2-2 phase-shifts the first negative-phase signal $-\cos(\omega t)$ by the phase shift amount d, and outputs the phase-shifted first negative-phase signal $-\cos(\omega t+d)$ to each of the sixth multiplier 3-6 and the seventh multiplier 3-7 from the output terminal 2-2b.

An input terminal 2-3a of the phase shifter 2-3 is connected to a signal input terminal 1c, and an output terminal 2-3b of the phase shifter 2-3 is connected to each of an input terminal 3-1b of a first multiplier 3-1 described later and an input terminal 3-4b of a fourth multiplier 3-4 described later.

When the second positive-phase signal $\cos(\omega t+p)$ input from the signal input terminal 1c is input from the input terminal 2-3a to the phase shifter 2-3, the phase shifter 2-3 phase-shifts the second positive-phase signal $\cos(\omega t+p)$ by the phase shift amount d, and outputs the phase-shifted second positive-phase signal $\cos(\omega t+\varphi+d)$ to each of the first multiplier 3-1 and the fourth multiplier 3-4 from the output terminal 2-3b.

An input terminal 2-4a of the phase shifter 2-4 is connected to a signal input terminal 1d, and an output terminal 2-4b of the phase shifter 2-4 is connected to each of an input terminal 3-2b of a second multiplier 3-2 described later and an input terminal 3-3b of a third multiplier 3-3 described later.

When the second negative-phase signal $-\cos(\omega t+p)$ input from the signal input terminal 1d is input from the input terminal 2-4a to the phase shifter 2-4, the phase shifter 2-4 phase-shifts the second negative-phase signal $-\cos(\omega t+p)$ by the phase shift amount d, and outputs the phase-shifted second negative-phase signal $-\cos(\omega t+\varphi+d)$ to each of the second multiplier 3-2 and the third multiplier 3-3 from the output terminal 2-4b.

The multiplication circuit 3 includes the first multiplier 3-1, the second multiplier 3-2, the third multiplier 3-3, the fourth multiplier 3-4, the fifth multiplier 3-5, the sixth multiplier 3-6, the seventh multiplier 3-7, and the eighth multiplier 3-8. In FIG. 1, each of the first multiplier 3-1, the second multiplier 3-2, the third multiplier 3-3, the fourth multiplier 3-4, the fifth multiplier 3-5, the sixth multiplier 3-6, the seventh multiplier 3-7, and the eighth multiplier 3-8 is represented by "x".

The multiplication circuit 3 performs multiplication of two signals for all combinations of the first positive-phase signal $\cos(\omega t)$ included in the first differential signal and the first negative-phase signal $-\cos(\omega t)$ included in the first differential signal with the second positive-phase signal $\cos(\omega t+\varphi+d)$ phase-shifted by the phase shift circuit 2 and the second negative-phase signal $-\cos(\omega t+\varphi+d)$ phase-shifted by the phase shift circuit 2.

The multiplication circuit 3 outputs each of $\cos(\omega t)\times\cos(\omega t+\varphi+d)$, $-\cos(\omega t)\times\cos(\omega t+\varphi+d)$, $\cos(\omega t)\times\cos(\omega t+\varphi+d)$, and $-\cos(\omega t)\times\cos(\omega t+\varphi+d)$ to a phase difference calculating circuit 4 as a multiplication signal indicating a result of the multiplication.

The multiplication circuit 3 performs multiplication of two signals for all combinations of the first positive-phase signal $\cos(\omega t+d)$ phase-shifted by the phase shift circuit 2 and the first negative-phase signal $-\cos(\omega t+d)$ phase-shifted by the phase shift circuit 2 with the second positive-phase signal $\cos(\omega t+p)$ included in the second differential signal and the second negative-phase signal $-\cos(\omega t+p)$ included in the second differential signal.

The multiplication circuit 3 outputs each of $\cos(\omega t+d)\times\cos(\omega t+p)$, $-\cos(\omega t+d)\times\cos(\omega t+p)$, $\cos(\omega t+d)\times\cos(\omega t+p)$, and −cos(ωt+d)×cos(ωt+(p) to the phase difference calculating circuit 4 as a multiplication signal indicating a result of the multiplication.

An input terminal 3-1a of the first multiplier 3-1 is connected to the signal input terminal 1a, the input terminal 3-1b of the first multiplier 3-1 is connected to the output terminal 2-3b of the phase shifter 2-3, and an output terminal 3-1c of the first multiplier 3-1 is connected to a two-way divider 5-1 described later.

The first positive-phase signal cos(ωt) input from the signal input terminal 1a is input to the input terminal 3-1a of the first multiplier 3-1.

The phase-shifted second positive-phase signal cos(ωt+φ+d) output from the phase shifter 2-3 is input to the input terminal 3-1b of the first multiplier 3-1.

The first multiplier 3-1 multiplies the first positive-phase signal cos(ωt) by the phase-shifted second positive-phase signal cos(ωt+φ+d), and outputs a first multiplication signal cos(ωt)×cos(ωt+φ+d) indicating a result of the multiplication to the two-way divider 5-1.

An input terminal 3-2a of the second multiplier 3-2 is connected to the signal input terminal 1a, the input terminal 3-2b of the second multiplier 3-2 is connected to the output terminal 2-4b of the phase shifter 2-4, and an output terminal 3-2c of the second multiplier 3-2 is connected to a two-way divider 5-2 described later.

The first positive-phase signal cos(ωt) input from the signal input terminal 1a is input to the input terminal 3-2a of the second multiplier 3-2.

The phase-shifted second negative-phase signal −cos(ωt+φ+d) output from the phase shifter 2-4 is input to the input terminal 3-2b of the second multiplier 3-2.

The second multiplier 3-2 multiplies the first positive-phase signal cos(ωt) by the phase-shifted second negative-phase signal −cos(ωt+φ+d), and outputs a second multiplication signal −cos(ωt)×cos(ωt+φ+d) indicating a result of the multiplication to the two-way divider 5-2.

An input terminal 3-3a of the third multiplier 3-3 is connected to the signal input terminal 1b, the input terminal 3-3b of the third multiplier 3-3 is connected to the output terminal 2-4b of the phase shifter 2-4, and an output terminal 3-3c of the third multiplier 3-3 is connected to a two-way divider 5-3 described later.

The first negative-phase signal −cos(ωt) input from the signal input terminal 1b is input to the input terminal 3-3a of the third multiplier 3-3.

The phase-shifted second negative-phase signal −cos(ωt+φ+d) output from the phase shifter 2-4 is input to the input terminal 3-3b of the third multiplier 3-3.

The third multiplier 3-3 multiplies the first negative-phase signal −cos(ωt) by the phase-shifted second negative-phase signal −cos(ωt+φ+d), and outputs a third multiplication signal cos(ωt)×cos(ωt+φ+d) indicating a result of the multiplication to the two-way divider 5-3.

An input terminal 3-4a of the fourth multiplier 3-4 is connected to the signal input terminal 1b, the input terminal 3-4b of the fourth multiplier 3-4 is connected to the output terminal 2-3b of the phase shifter 2-3, and an output terminal 3-4c of the fourth multiplier 3-4 is connected to a two-way divider 5-4 described later.

The first negative-phase signal −cos(ωt) input from the signal input terminal 1b is input to the input terminal 3-4a of the fourth multiplier 3-4.

The phase-shifted second positive-phase signal cos(ωt+φ+d) output from the phase shifter 2-3 is input to the input terminal 3-4b of the fourth multiplier 3-4.

The fourth multiplier 3-4 multiplies the first negative-phase signal −cos(ωt) by the phase-shifted second positive-phase signal cos(ωt+φ+d), and outputs a fourth multiplication signal −cos(ωt)×cos(ωt+φ+d) indicating a result of the multiplication to the two-way divider 5-4.

An input terminal 3-5a of the fifth multiplier 3-5 is connected to the signal input terminal 1c, the input terminal 3-5b of the fifth multiplier 3-5 is connected to the output terminal 2-1b of the phase shifter 2-1, and an output terminal 3-5c of the fifth multiplier 3-5 is connected to a two-way divider 5-5 described later.

The second positive-phase signal cos(ωt+(p) input from the signal input terminal 1c is input to the input terminal 3-5a of the fifth multiplier 3-5.

The phase-shifted first positive-phase signal cos(ωt+d) output from the phase shifter 2-1 is input to the input terminal 3-5b of the fifth multiplier 3-5.

The fifth multiplier 3-5 multiplies the second positive-phase signal cos(ωt+(p) by the phase-shifted first positive-phase signal cos(ωt+d), and outputs a fifth multiplication signal cos(ωt+d)×cos(ωt+(p) indicating a result of the multiplication to the two-way divider 5-5.

An input terminal 3-6a of the sixth multiplier 3-6 is connected to the signal input terminal 1c, the input terminal 3-6b of the sixth multiplier 3-6 is connected to the output terminal 2-2b of the phase shifter 2-2, and an output terminal 3-6c of the sixth multiplier 3-6 is connected to a two-way divider 5-6 described later.

The second positive-phase signal cos(ωt+(p) input from the signal input terminal 1c is input to the input terminal 3-6a of the sixth multiplier 3-6.

The phase-shifted first negative-phase signal −cos(ωt+d) output from the phase shifter 2-2 is input to the input terminal 3-6b of the sixth multiplier 3-6.

The sixth multiplier 3-6 multiplies the second positive-phase signal cos(ωt+(p) by the phase-shifted first negative-phase signal −cos(ωt+d), and outputs a sixth multiplication signal −cos(ωt+d)×cos(ωt+(p) indicating a result of the multiplication to the two-way divider 5-6.

An input terminal 3-7a of the seventh multiplier 3-7 is connected to the signal input terminal 1d, the input terminal 3-7b of the seventh multiplier 3-7 is connected to the output terminal 2-2b of the phase shifter 2-2, and an output terminal 3-7c of the seventh multiplier 3-7 is connected to a two-way divider 5-7 described later.

The second negative-phase signal −cos(ωt+(p) input from the signal input terminal 1d is input to the input terminal 3-7a of the seventh multiplier 3-7.

The phase-shifted first negative-phase signal −cos(ωt+d) output from the phase shifter 2-2 is input to the input terminal 3-7b of the seventh multiplier 3-7.

The seventh multiplier 3-7 multiplies the second negative-phase signal −cos(ωt+φ) by the phase-shifted first negative-phase signal −cos(ωt+d), and outputs a seventh multiplication signal cos(ωt+d)×cos(ωt+φ) indicating a result of the multiplication to the two-way divider 5-7.

An input terminal 3-8a of the eighth multiplier 3-8 is connected to the signal input terminal 1d, the input terminal 3-8b of the eighth multiplier 3-8 is connected to the output terminal 2-1b of the phase shifter 2-1, and an output terminal 3-8c of the eighth multiplier 3-8 is connected to a two-way divider 5-8 described later.

The second negative-phase signal −cos(ωt+φ) input from the signal input terminal 1d is input to the input terminal 3-8a of the eighth multiplier 3-8.

The phase-shifted first positive-phase signal $\cos(\omega t+d)$ output from the phase shifter 2-1 is input to the input terminal 3-8b of the eighth multiplier 3-8.

The eighth multiplier 3-8 multiplies the second negative-phase signal $-\cos(\omega t+\varphi)$ by the phase-shifted first positive-phase signal $\cos(\omega t+d)$, and outputs an eighth multiplication signal $-\cos(\omega t+d)\times\cos(\omega t+\varphi)$ indicating a result of the multiplication to the two-way divider 5-8.

The phase difference calculating circuit 4 includes the two-way dividers 5-1 to 5-8, a first addition circuit 6-1, a second addition circuit 6-2, a third addition circuit 6-3, a fourth addition circuit 6-4, a first subtraction circuit 7-1, a second subtraction circuit 7-2, a filter 8, a calculation processing circuit 9, and a signal output terminal 10.

In FIG. 1, each of the two-way dividers 5-1 to 5-8 is represented by "DIV", and each of the first addition circuit 6-1, the second addition circuit 6-2, the third addition circuit 6-3, and the fourth addition circuit 6-4 is represented by "+".

The phase difference calculating circuit 4 calculates a phase difference $\varphi$ between a first differential signal and a second differential signal using all multiplication signals output from the multiplication circuit 3.

The two-way divider 5-1 outputs the first multiplication signal $\cos(\omega t)\times\cos(\omega t+\varphi+d)$ output from the first multiplier 3-1 to the first addition circuit 6-1.

In addition, the two-way divider 5-1 outputs the first multiplication signal $\cos(\omega t)\times\cos(\omega t+\varphi+d)$ output from the first multiplier 3-1 to the third addition circuit 6-3.

The two-way divider 5-2 outputs the second multiplication signal $-\cos(\omega t)\times\cos(\omega t+\varphi+d)$ output from the second multiplier 3-2 to the second addition circuit 6-2.

In addition, the two-way divider 5-2 outputs the second multiplication signal $-\cos(\omega t)\times\cos(\omega t+\varphi+d)$ output from the second multiplier 3-2 to the fourth addition circuit 6-4.

The two-way divider 5-3 outputs the third multiplication signal $\cos(\omega t)\times\cos(\omega t+\varphi+d)$ output from the third multiplier 3-3 to the first addition circuit 6-1.

In addition, the two-way divider 5-3 outputs the third multiplication signal $\cos(\omega t)\times\cos(\omega t+\varphi+d)$ output from the third multiplier 3-3 to the third addition circuit 6-3.

The two-way divider 5-4 outputs the fourth multiplication signal $-\cos(\omega t)\times\cos(\omega t+\varphi+d)$ output from the fourth multiplier 3-4 to the second addition circuit 6-2.

In addition, the two-way divider 5-4 outputs the fourth multiplication signal $-\cos(\omega t)\times\cos(\omega t+\varphi+d)$ output from the fourth multiplier 3-4 to the fourth addition circuit 6-4.

The two-way divider 5-5 outputs the fifth multiplication signal $\cos(\omega t+d)\times\cos(\omega t+\varphi)$ output from the fifth multiplier 3-5 to the first addition circuit 6-1.

In addition, the two-way divider 5-5 outputs the fifth multiplication signal $\cos(\omega t+d)\times\cos(\omega t+\varphi)$ output from the fifth multiplier 3-5 to the fourth addition circuit 6-4.

The two-way divider 5-6 outputs the sixth multiplication signal $-\cos(\omega t+d)\times\cos(\omega t+\varphi)$ output from the sixth multiplier 3-6 to the second addition circuit 6-2.

In addition, the two-way divider 5-6 outputs the sixth multiplication signal $-\cos(\omega t+d)\times\cos(\omega t+\varphi)$ output from the sixth multiplier 3-6 to the third addition circuit 6-3.

The two-way divider 5-7 outputs the seventh multiplication signal $\cos(\omega t+d)\times\cos(\omega t+\varphi)$ output from the seventh multiplier 3-7 to the first addition circuit 6-1.

In addition, the two-way divider 5-7 outputs the seventh multiplication signal $\cos(\omega t+d)\times\cos(\omega t+\varphi)$ output from the seventh multiplier 3-7 to the fourth addition circuit 6-4.

The two-way divider 5-8 outputs the eighth multiplication signal $-\cos(\omega t+d)\times\cos(\omega t+\varphi)$ output from the eighth multiplier 3-8 to the second addition circuit 6-2.

In addition, the two-way divider 5-8 outputs the eighth multiplication signal $-\cos(\omega t+d)\times\cos(\omega t+\varphi)$ output from the eighth multiplier 3-8 to the third addition circuit 6-3.

The first addition circuit 6-1 adds the first multiplication signal $\cos(\omega t)\times\cos(\omega t+\varphi+d)$ output from the two-way divider 5-1, the third multiplication signal $\cos(\omega t)\times\cos(\omega t+\varphi+d)$ output from the two-way divider 5-3, the fifth multiplication signal $\cos(\omega t+d)\times\cos(\omega t+\varphi)$ output from the two-way divider 5-5, and the seventh multiplication signal $\cos(\omega t+d)\times\cos(\omega t+\varphi)$ output from the two-way divider 5-7.

The first addition circuit 6-1 outputs a first addition signal $2\cdot\cos(2\omega t+\varphi+d)+\cos(\omega+d)+\cos(\omega-d)$ indicating a result of the addition to the first subtraction circuit 7-1.

The second addition circuit 6-2 adds the second multiplication signal $-\cos(\omega t)\times\cos(\omega t+\varphi+d)$ output from the two-way divider 5-2, the fourth multiplication signal $-\cos(\omega t)\times\cos(\omega t+\varphi+d)$ output from the two-way divider 5-4, the sixth multiplication signal $-\cos(\omega t+d)\times\cos(\omega t+\varphi)$ output from the two-way divider 5-6, and the eighth multiplication signal $-\cos(\omega t+d)\times\cos(\omega t+\varphi)$ output from the two-way divider 5-8.

The second addition circuit 6-2 outputs a second addition signal $-2\cdot\cos(2\omega t+\varphi+d)+\cos(\omega+d)+\cos(\omega-d)$ indicating a result of the addition to the first subtraction circuit 7-1.

The third addition circuit 6-3 adds the first multiplication signal $\cos(\omega t)\times\cos(\omega t+\varphi+d)$ output from the two-way divider 5-1, the third multiplication signal $\cos(\omega t)\times\cos(\omega t+\varphi+d)$ output from the two-way divider 5-3, the sixth multiplication signal $-\cos(\omega t+d)\times\cos(\omega t+\varphi)$ output from the two-way divider 5-6, and the eighth multiplication signal $-\cos(\omega t+d)\times\cos(\omega t+\varphi)$ output from the two-way divider 5-8.

The third addition circuit 6-3 outputs a third addition signal $-4\cdot\sin(\varphi)\sin(d)$ indicating a result of the addition to the second subtraction circuit 7-2.

The fourth addition circuit 6-4 adds the second multiplication signal $-\cos(\omega t)\times\cos(\omega t+\varphi+d)$ output from the two-way divider 5-2, the fourth multiplication signal $-\cos(\omega t)\times\cos(\omega t+\varphi+d)$ output from the two-way divider 5-4, the fifth multiplication signal $\cos(\omega t+d)\times\cos(\omega t+\varphi)$ output from the two-way divider 5-5, and the seventh multiplication signal $\cos(\omega t+d)\times\cos(\omega t+\varphi)$ output from the two-way divider 5-7.

The fourth addition circuit 6-4 outputs a fourth addition signal $4\cdot\sin(\omega)\sin(d)$ indicating a result of the addition to the second subtraction circuit 7-2.

The first subtraction circuit 7-1 subtracts the second addition signal $-2\cdot\cos(2\omega t+\varphi+d)+\cos(\omega+d)+\cos(\omega-d)$ output from the second addition circuit 6-2 from the first addition signal $2\cdot\cos(2\omega t+\varphi+d)+\cos(\omega+d)+\cos(\omega-d)$ output from the first addition circuit 6-1.

The first subtraction circuit 7-1 outputs a first subtraction signal $4\cdot\cos(2\omega t+\varphi+d)$ indicating a result of the subtraction to the filter 8.

The second subtraction circuit 7-2 subtracts the third addition signal $-4\cdot\sin(\varphi)\sin(d)$ output from the third addition circuit 6-3 from the fourth addition signal $4\cdot\sin(\varphi)\sin(d)$ output from the fourth addition circuit 6-4.

The second subtraction circuit 7-2 outputs a second subtraction signal $8\cdot\sin(\varphi)\sin(d)$ indicating a result of the subtraction to the calculation processing circuit 9.

The filter 8 is implemented by, for example, a low pass filter (LPF) or a band pass filter (BPF).

The filter 8 removes a high-frequency component included in the first subtraction signal $4\cdot\cos(2\omega t+\varphi+d)$ output from the first subtraction circuit 7-1.

The filter 8 outputs the first subtraction signal $8\cdot\cos(\omega)\cos(d)$ after removal of the high-frequency component to the calculation processing circuit 9.

The calculation processing circuit 9 calculates a phase difference $\varphi$ between a first differential signal and a second differential signal from the first subtraction signal $8 \cdot \cos(\omega)\cos(d)$ after removal of the high-frequency component output from the filter 8 and the second subtraction signal $8 \cdot \sin(\omega)\sin(d)$ output from the second subtraction circuit 7-2.

The calculation processing circuit 9 outputs the calculated phase difference $\varphi$ to the signal output terminal 10.

The signal output terminal 10 is a terminal for outputting the phase difference $\varphi$ calculated by the calculation processing circuit 9 to the outside.

Next, an operation of the phase detector illustrated in FIG. 1 will be described.

The phase detector illustrated in FIG. 1 calculates a phase difference $\varphi$ between a first differential signal and a second differential signal.

The first positive-phase signal $\cos(\omega t)$ included in the first differential signal is input from the signal input terminal 1a, and the first negative-phase signal $-\cos(\omega t)$ included in the first differential signal is input from the signal input terminal 1b.

The second positive-phase signal $\cos(\omega t+\varphi)$ included in the second differential signal is input from the signal input terminal 1c, and the second negative-phase signal $-\cos(\omega t+\varphi)$ included in the second differential signal is input from the signal input terminal 1d.

When the first positive-phase signal $\cos(\omega t)$ input from the signal input terminal 1a is input from the input terminal 2-1a to the phase shifter 2-1, the phase shifter 2-1 phase-shifts the first positive-phase signal $\cos(\omega t)$ by a phase shift amount d.

The phase shifter 2-1 outputs the phase-shifted first positive-phase signal $\cos(\omega t+d)$ from the output terminal 2-1b to each of the fifth multiplier 3-5 and the eighth multiplier 3-8.

When the first negative-phase signal $-\cos(\omega t)$ input from the signal input terminal 1b is input from the input terminal 2-2a to the phase shifter 2-2, the phase shifter 2-2 phase-shifts the first negative-phase signal $-\cos(\omega t)$ by the phase shift amount d.

The phase shifter 2-2 outputs the phase-shifted first negative-phase signal $-\cos(\omega t+d)$ from the output terminal 2-2b to each of the sixth multiplier 3-6 and the seventh multiplier 3-7.

When the second positive-phase signal $\cos(\omega t+\varphi)$ input from the signal input terminal 1c is input from the input terminal 2-3a to the phase shifter 2-3, the phase shifter 2-3 phase-shifts the second positive-phase signal $\cos(\omega t+\varphi)$ by the phase shift amount d.

The phase shifter 2-3 outputs the phase-shifted second positive-phase signal $\cos(\omega t+\varphi+d)$ from the output terminal 2-3b to each of the first multiplier 3-1 and the fourth multiplier 3-4.

When the second negative-phase signal $-\cos(\omega t+\varphi)$ input from the signal input terminal 1d is input from the input terminal 2-4a to the phase shifter 2-4, the phase shifter 2-4 phase-shifts the second negative-phase signal $-\cos(\omega t+\varphi)$ by the phase shift amount d.

The phase shifter 2-4 outputs the phase-shifted second negative-phase signal $-\cos(\omega t+\varphi+d)$ from the output terminal 2-4b to each of the second multiplier 3-2 and the third multiplier 3-3.

The first positive-phase signal $\cos(\omega t)$ input from the signal input terminal 1a is input to the input terminal 3-1a of the first multiplier 3-1, and the phase-shifted second positive-phase signal $\cos(\omega t+\varphi+d)$ output from the phase shifter 2-3 is input to the input terminal 3-1b.

The first multiplier 3-1 multiplies the first positive-phase signal $\cos(\omega t)$ by the phase-shifted second positive-phase signal $\cos(\omega t+\varphi+d)$.

The first multiplier 3-1 outputs a first multiplication signal $\cos(\omega t) \times \cos(\omega t+\varphi+d)$ indicating a result of the multiplication to the two-way divider 5-1.

The first positive-phase signal $\cos(\omega t)$ input from the signal input terminal 1a is input to the input terminal 3-2a of the second multiplier 3-2, and the phase-shifted second negative-phase signal $-\cos(\omega t+\varphi+d)$ output from the phase shifter 2-4 is input to the input terminal 3-2b.

The second multiplier 3-2 multiplies the first positive-phase signal $\cos(\omega t)$ by the phase-shifted second negative-phase signal $-\cos(\omega t+\varphi+d)$.

The second multiplier 3-2 outputs a second multiplication signal $-\cos(\omega t) \times \cos(\omega t+\varphi+d)$ indicating a result of the multiplication to the two-way divider 5-2.

The first negative-phase signal $-\cos(\omega t)$ input from the signal input terminal 1b is input to the input terminal 3-3a of the third multiplier 3-3, and the phase-shifted second negative-phase signal $-\cos(\omega t+\varphi+d)$ output from the phase shifter 2-4 is input to the input terminal 3-3b.

The third multiplier 3-3 multiplies the first negative-phase signal $-\cos(\omega t)$ by the phase-shifted second negative-phase signal $-\cos(\omega t+\varphi+d)$.

The third multiplier 3-3 outputs a third multiplication signal $\cos(\omega t) \times \cos(\omega t+\varphi+d)$ indicating a result of the multiplication to the two-way divider 5-3.

The first negative-phase signal $-\cos(\omega t)$ input from the signal input terminal 1b is input to the input terminal 3-4a of the fourth multiplier 3-4, and the phase-shifted second positive-phase signal $\cos(\omega t+\varphi+d)$ output from the phase shifter 2-3 is input to the input terminal 3-4b.

The fourth multiplier 3-4 multiplies the first negative-phase signal $-\cos(\omega t)$ by the phase-shifted second positive-phase signal $\cos(\omega t+\varphi+d)$.

The fourth multiplier 3-4 outputs a fourth multiplication signal $-\cos(\omega t) \times \cos(\omega t+\varphi+d)$ indicating a result of the multiplication to the two-way divider 5-4.

The second positive-phase signal $\cos(\omega t+\varphi)$ input from the signal input terminal 1c is input to the input terminal 3-5a of the fifth multiplier 3-5, and the phase-shifted first positive-phase signal $\cos(\omega t+d)$ output from the phase shifter 2-1 is input to the input terminal 3-5b.

The fifth multiplier 3-5 multiplies the second positive-phase signal $\cos(\omega t+\varphi)$ by the phase-shifted first positive-phase signal $\cos(\omega t+d)$.

The fifth multiplier 3-5 outputs a fifth multiplication signal $\cos(\omega t+d) \times \cos(\omega t+\varphi)$ indicating a result of the multiplication to the two-way divider 5-5.

The second positive-phase signal $\cos(\omega t+\varphi)$ input from the signal input terminal 1c is input to the input terminal 3-6a of the sixth multiplier 3-6, and the phase-shifted first negative-phase signal $-\cos(\omega t+d)$ output from the phase shifter 2-2 is input to the input terminal 3-6b.

The sixth multiplier 3-6 multiplies the second positive-phase signal $\cos(\omega t+\varphi)$ by the phase-shifted first negative-phase signal $-\cos(\omega t+d)$.

The sixth multiplier 3-6 outputs a sixth multiplication signal $-\cos(\omega t+d) \times \cos(\omega t+\varphi)$ indicating a result of the multiplication to the two-way divider 5-6.

The second negative-phase signal $-\cos(\omega t+\varphi)$ input from the signal input terminal 1d is input to the input terminal 3-7a of the seventh multiplier 3-7, and the phase-shifted first negative-phase signal $-\cos(\omega t+d)$ output from the phase shifter 2-2 is input to the input terminal 3-7b.

The seventh multiplier 3-7 multiplies the second negative-phase signal −cos(ωt+φ) by the phase-shifted first negative-phase signal −cos(ωt+d).

The seventh multiplier 3-7 outputs a seventh multiplication signal cos(ωt+d)×cos(ωt+φ) indicating a result of the multiplication to the two-way divider 5-7.

The second negative-phase signal −cos(ωt+φ) input from the signal input terminal 1*d* is input to the input terminal 3-8*a* of the eighth multiplier 3-8, and the phase-shifted first positive-phase signal cos(ωt+d) output from the phase shifter 2-1 is input to the input terminal 3-8*b*.

The eighth multiplier 3-8 multiplies the second negative-phase signal −cos(ωt+φ) by the phase-shifted first positive-phase signal cos(ωt+d).

The eighth multiplier 3-8 outputs an eighth multiplication signal −cos(ωt+d)×cos(ωt+φ) indicating a result of the multiplication to the two-way divider 5-8.

When receiving the first multiplication signal cos(ωt)×cos(ωt+φ+d) from the first multiplier 3-1, the two-way divider 5-1 outputs the first multiplication signal cos(ωt)×cos(ωt+φ+d) to each of the first addition circuit 6-1 and the third addition circuit 6-3.

When receiving the second multiplication signal −cos(ωt)×cos(ωt+φ+d) from the second multiplier 3-2, the two-way divider 5-2 outputs the second multiplication signal −cos(ωt)×cos(ωt+φ+d) to each of the second addition circuit 6-2 and the fourth addition circuit 6-4.

When receiving the third multiplication signal cos(ωt)×cos(ωt+φ+d) from the third multiplier 3-3, the two-way divider 5-3 outputs the third multiplication signal cos(ωt)×cos(ωt+φ+d) to each of the first addition circuit 6-1 and the third addition circuit 6-3.

When receiving the fourth multiplication signal −cos(ωt)×cos(ωt+φ+d) from the fourth multiplier 3-4, the two-way divider 5-4 outputs the fourth multiplication signal −cos(ωt)×cos(ωt+φ+d) to each of the second addition circuit 6-2 and the fourth addition circuit 6-4.

When receiving the fifth multiplication signal cos(ωt+d)×cos(ωt+φ) from the fifth multiplier 3-5, the two-way divider 5-5 outputs the fifth multiplication signal cos(ωt+d)×cos(ωt+φ) to each of the first addition circuit 6-1 and the fourth addition circuit 6-4.

When receiving the sixth multiplication signal −cos(ωt+d)×cos(ωt+φ) from the sixth multiplier 3-6, the two-way divider 5-6 outputs the sixth multiplication signal −cos(ωt+d)×cos(ωt+φ) to each of the second addition circuit 6-2 and the third addition circuit 6-3.

When receiving the seventh multiplication signal cos(ωt+d)×cos(ωt+φ) from the seventh multiplier 3-7, the two-way divider 5-7 outputs the seventh multiplication signal cos(ωt+d)×cos(ωt+φ) to each of the first addition circuit 6-1 and the fourth addition circuit 6-4.

When receiving the eighth multiplication signal −cos(ωt+d)×cos(ωt+φ) from the eighth multiplier 3-8, the two-way divider 5-8 outputs the eighth multiplication signal −cos(ωt+d)×cos(ωt+φ) to each of the second addition circuit 6-2 and the third addition circuit 6-3.

To the first addition circuit 6-1, the first multiplication signal cos(ωt)×cos(ωt+φ+d) output from the two-way divider 5-1, the third multiplication signal cos(ωt)×cos(ωt+φ+d) output from the two-way divider 5-3, the fifth multiplication signal cos(ωt+d)×cos(ωt+φ) output from the two-way divider 5-5, and the seventh multiplication signal cos(ωt+d)×cos(ωt+φ) output from the two-way divider 5-7 are input.

The first addition circuit 6-1 adds the first multiplication signal cos(ωt)×cos(ωt+φ+d), the third multiplication signal cos(ωt)×cos(ωt+φ+d), the fifth multiplication signal cos(ωt+d)×cos(ωt+φ), and the seventh multiplication signal cos(ωt+d)×cos(ωt+φ).

The first addition circuit 6-1 outputs a first addition signal 2·cos(2ωt+φ+d)+cos(φ+d)+cos(ω−d) indicating a result of the addition to the first subtraction circuit 7-1.

To the second addition circuit 6-2, the second multiplication signal −cos(ωt)×cos(ωt+φ+d) output from the two-way divider 5-2, the fourth multiplication signal −cos(ωt)×cos(ωt+φ+d) output from the two-way divider 5-4, the sixth multiplication signal −cos(ωt+d)×cos(ωt+φ) output from the two-way divider 5-6, and the eighth multiplication signal −cos(ωt+d)×cos(ωt+φ) output from the two-way divider 5-8 are input.

The second addition circuit 6-2 adds the second multiplication signal −cos(ωt)×cos(ωt+φ+d), the fourth multiplication signal −cos(ωt)×cos(ωt+φ+d), the sixth multiplication signal −cos(ωt+d)×cos(ωt+φ), and the eighth multiplication signal −cos(ωt+d)×cos(ωt+φ).

The second addition circuit 6-2 outputs a second addition signal −2·cos(2ωt+φ+d)+cos(ω+d)+cos(ω−d) indicating a result of the addition to the first subtraction circuit 7-1.

To the third addition circuit 6-3, the first multiplication signal cos(ωt)×cos (ωt+φ+d) output from the two-way divider 5-1, the third multiplication signal cos (ωt)×cos(ωt+φ+d) output from the two-way divider 5-3, the sixth multiplication signal −cos(ωt+d)×cos(ωt+φ) output from the two-way divider 5-6, and the eighth multiplication signal −cos (ωt+d)×cos(ωt+φ) output from the two-way divider 5-8 are input.

The third addition circuit 6-3 adds the first multiplication signal cos(ωt)×cos (ωt+φ+d), the third multiplication signal cos(ωt)×cos(ωt+φ+d), the sixth multiplication signal −cos (ωt+d)×cos(ωt+φ), and the eighth multiplication signal −cos (ωt+d)×cos(ωt+φ).

The third addition circuit 6-3 outputs a third addition signal −4·sin(ω)sin(d) indicating a result of the addition to the second subtraction circuit 7-2.

To the fourth addition circuit 6-4, the second multiplication signal −cos(ωt)×cos(ωt+φ+d) output from the two-way divider 5-2, the fourth multiplication signal −cos(ωt)×cos (ωt+φ+d) output from the two-way divider 5-4, the fifth multiplication signal cos(ωt+d)×cos(ωt+φ) output from the two-way divider 5-5, and the seventh multiplication signal cos(ωt+d)×cos(ωt+φ) output from the two-way divider 5-7 are input.

The fourth addition circuit 6-4 adds the second multiplication signal −cos(ωt)×cos(ωt+φ+d), the fourth multiplication signal −cos(ωt)×cos(ωt+φ+d), the fifth multiplication signal cos(ωt+d)×cos(ωt+φ), and the seventh multiplication signal cos(ωt+d)×cos(ωt+φ).

The fourth addition circuit 6-4 outputs a fourth addition signal 4·sin(ω)sin(d) indicating a result of the addition to the second subtraction circuit 7-2.

To the first subtraction circuit 7-1, the first addition signal 2·cos(2ωt+φ+d)+cos(φ+d)+cos(φ−d) output from the first addition circuit 6-1 and the second addition signal −2·cos(2ωt+φ+d)+cos(φ+d)+cos(φ−d) output from the second addition circuit 6-2 are input.

The first subtraction circuit 7-1 subtracts the second addition signal −2·cos(2ωt+φ+d)+cos(φ+d)+cos(φ−d) from the first addition signal 2·cos(2ωt+φ+d)+cos(φ+d)+cos(φ−d).

The first subtraction circuit 7-1 outputs a first subtraction signal 4·cos(2ωt+φ+d) indicating a result of the subtraction to the filter 8.

To the second subtraction circuit 7-2, the fourth addition signal 4·sin(ω)sin(d) output from the fourth addition circuit 6-4 and the third addition signal −4·sin(ω)sin(d) output from the third addition circuit 6-3 are input.

The second subtraction circuit 7-2 subtracts the third addition signal −4·sin(φ) sin(d) from the fourth addition signal 4·sin(ω)sin(d).

The second subtraction circuit 7-2 outputs a second subtraction signal 8·sin(φ) sin(d) indicating a result of the subtraction to the calculation processing circuit 9.

When receiving the first subtraction signal 4·cos(2ωt+φ+d) from the first subtraction circuit 7-1, the filter 8 removes a high-frequency component included in the first subtraction signal 4·cos(2ωt+φ+d).

The high-frequency component included in the first subtraction signal 4·cos (2ωt+φ+d) is a component other than a DC component included in the first subtraction signal 4·cos (2ωt+φ+d).

The filter 8 outputs the first subtraction signal 8·cos(ω) cos(d) after removal of the high-frequency component to the calculation processing circuit 9.

To the calculation processing circuit 9, the first subtraction signal 8·cos(ω)cos(d) after removal of the high-frequency component output from the filter 8 and the second subtraction signal 8·sin(ω)sin(d) output from the second subtraction circuit 7-2 are input.

The calculation processing circuit 9 calculates a phase difference ci between a first differential signal and a second differential signal from the first subtraction signal 8·cos(ω) cos(d) after removal of the high-frequency component and the second subtraction signal 8·sin(ω)sin(d) as indicated in the following formula (1).

$$\phi = \tan^{-1}\left(\frac{8 \cdot \sin(\phi)\sin(d)}{8 \cdot \cos(\phi)\cos(d)} \times \frac{\cos(d)}{\sin(d)}\right) \quad (1)$$

Since the phase shift amount d of the phase shift circuit 2 is a predetermined value, each of cos(d) and sin(d) is also a predetermined value. For example, each of cos(d) and sin(d) may be stored in an internal memory of the calculation processing circuit 9, or may be provided from the outside of the phase detector illustrated in FIG. 1.

The calculation processing circuit 9 outputs the calculated phase difference ci to the signal output terminal 10.

In the calculation formula of the phase difference φ indicated in formula (1), with a phase shift amount d in which cos(d) or sin(d) is not zero, the phase difference φ between a first differential signal and a second differential signal can be calculated. The phase shift amount d in which cos(d) or sin(d) is not zero is a phase shift amount other than 0 degrees, 90 degrees, 180 degrees, or 270 degrees.

Therefore, in the phase detector illustrated in FIG. 1, a range in which the phase difference φ can be detected is not limited to a range of 180 degrees.

In the phase detector illustrated in FIG. 1, the phase shift amount is d.

For example, when the phase shift amount satisfies d=45 degrees, the first subtraction signal after removal of the high-frequency component output from the filter 8 is 8·cos (ω)cos(45). In addition, the second subtraction signal output from the second subtraction circuit 7-2 is 8·sin(ω)sin(45).

The phase difference φ calculated by the calculation processing circuit 9 is represented by the following formula (2).

$$\phi = \tan^{-1}\left(\frac{8 \cdot \sin(\phi)\sin(45)}{8 \cdot \cos(\phi)\cos(45)} \times \frac{\cos(45)}{\sin(45)}\right) = \tan^{-1}\left(\frac{8 \cdot \sin(\phi)\sin(45)}{8 \cdot \cos(\phi)\cos(45)}\right) \quad (2)$$

When the phase shift amount satisfies d=45 degrees, the calculation processing circuit 9 does not need to multiply the term cos(d)/sin(d) as indicated by formula (2), and therefore the circuit of the calculation processing circuit 9 can be simplified as compared with a case of d 45 degrees.

In the first embodiment described above, the phase detector includes: the phase shift circuit 2 to phase-shift each of a first positive-phase signal included in a first differential signal and a first negative-phase signal included in the first differential signal, and phase-shift each of a second positive-phase signal included in a second differential signal and a second negative-phase signal included in the second differential signal; the multiplication circuit 3 to perform multiplication of two signals for all combinations of the first positive-phase signal included in the first differential signal and the first negative-phase signal included in the first differential signal with the second positive-phase signal phase-shifted by the phase shift circuit 2 and the second negative-phase signal phase-shifted by the phase shift circuit 2, output a multiplication signal indicating a result of the multiplication, perform multiplication of two signals for all combinations of the first positive-phase signal phase-shifted by the phase shift circuit 2 and the first negative-phase signal phase-shifted by the phase shift circuit 2 with the second positive-phase signal included in the second differential signal and the second negative-phase signal included in the second differential signal, and output a multiplication signal indicating a result of the multiplication; and the phase difference calculating circuit 4 to calculate a phase difference between the first differential signal and the second differential signal using all the multiplication signals output from the multiplication circuit 3. Therefore, the phase detector can calculate a phase difference between a first differential signal and a second differential signal without limiting a detection range of the phase difference to a range of 180 degrees.

In the phase detector illustrated in FIG. 1, each of the phase shifter 2-1, the phase shifter 2-2, the phase shifter 2-3, and the phase shifter 2-4 can be implemented by a distributed constant circuit.

A phase shift amount d in each of the phase shifter 2-1, the phase shifter 2-2, the phase shifter 2-3, and the phase shifter 2-4 only needs to be a phase shift amount other than 0 degrees, 90 degrees, 180 degrees, or 270 degrees, and may be, for example, a phase shift amount of less than 90 degrees.

When each of the phase shifter 2-1, the phase shifter 2-2, the phase shifter 2-3, and the phase shifter 2-4 is, for example, a phase shifter having a phase shift amount d of 20 degrees, the length of a line included in the distributed constant circuit is represented by the following formula (3) when the frequency of each of a first differential signal and a second differential signal is 1 (GHz). Formula (3) Length of line included in distributed constant circuit $$= \frac{1}{1(\text{GHz})} \times (3 \times 10^8 (m/s)) \times \frac{20}{360} = 0.016(m) = 1.6(\text{cm}) \quad (3)$$

In formula (3), $3 \times 10^8$ (m/s) is a speed in vacuum, and a speed on a substrate may be slower than $3 \times 10^8$ (m/s).

In addition, when the width of the line included in the distributed constant circuit is, for example, 10 (μm), the area occupied by the line included in the distributed constant circuit is represented by the following formula (4).

$$\text{Area} = 1.6 \text{ (cm)} \times 10 \text{ (μm)} = 1600 \text{ (μm}^2\text{)} \quad (4)$$

Note that as each of the phase shifter 2-1, the phase shifter 2-2, the phase shifter 2-3, and the phase shifter 2-4, a phase shifter having a phase shift amount d of 90 degrees cannot be used, but if a phase shifter having a phase shift amount d of 90 degrees is used, the length of the line included in the distributed constant circuit is 7.5 (cm). When the width of the line included in the distributed constant circuit is, for example, 10 (μm), the area occupied by the line included in the distributed constant circuit is 7500 (μm²).

Therefore, when each of the phase shifter 2-1, the phase shifter 2-2, the phase shifter 2-3, and the phase shifter 2-4 is, for example, a phase shifter having a phase shift amount d of 20 degrees, the area occupied by the line included in the distributed constant circuit is about half as compared with a case of a phase shifter having a phase shift amount d of 90 degrees.

In the phase detector illustrated in FIG. 1, each of the phase shifter 2-1, the phase shifter 2-2, the phase shifter 2-3, and the phase shifter 2-4 can be implemented by a lumped constant circuit. When each of the phase shifter 2-1, the phase shifter 2-2, the phase shifter 2-3, and the phase shifter 2-4 is implemented by the lumped constant circuit, it is possible to reduce the size as compared with a case where each of the phase shifter 2-1, the phase shifter 2-2, the phase shifter 2-3, and the phase shifter 2-4 is implemented by the distributed constant circuit.

Figure 2:
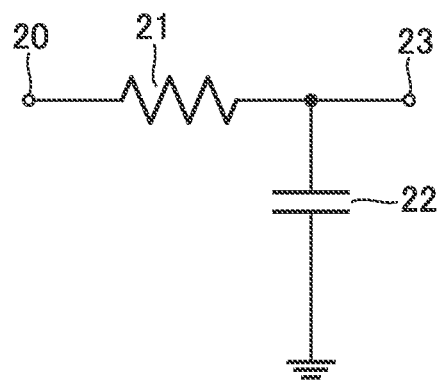
FIG. 2 is a configuration diagram illustrating an example of a phase shifter 2-1 implemented by a lumped constant circuit.

For example, as illustrated in FIG. 2, the phase shifter 2-1 can be implemented by a lumped constant circuit such as a low-pass filter including a resistor 21 and a capacitor 22.

FIG. 2 is a configuration diagram illustrating an example of the phase shifter 2-1 implemented by the lumped constant circuit. Each of the phase shifter 2-2, the phase shifter 2-3, and the phase shifter 2-4 can be configured similarly to the phase shifter 2-1.

In FIG. 2, an input terminal 20 is connected to the signal input terminal 1a.

An output terminal 23 is connected to each of the input terminal 3-5a of the fifth multiplier 3-5 and the input terminal 3-8a of the eighth multiplier 3-8.

One end of the resistor 21 is connected to the input terminal 20, and the other end of the resistor 21 is connected to each of one end of the capacitor 22 and the output terminal 23.

One end of the capacitor 22 is connected to each of the other end of the resistor 21 and the output terminal 23, and the other end of the capacitor 22 is grounded.

A transfer function Z of the phase shifter 2-1 illustrated in FIG. 2 is represented by the following formula (5).

$$Z = \frac{1}{1 + j\omega CR} \quad (5)$$

In formula (5), R represents a resistance value of the resistor 21, and C represents a capacitance value of the capacitor 22.

A passage gain |Z| of the phase shifter 2-1 illustrated in FIG. 2 is represented by the following formula (6), and a passage phase shift arg (Z) of the phase shifter 2-1 illustrated in FIG. 2 is represented by the following formula (7).

$$|Z| = \frac{1}{\sqrt{1 + j\omega CR}} \quad (6)$$

$$\arg(Z) = -\tan^{-1}(\omega CR) \quad (7)$$

When the phase shifter 2-1 illustrated in FIG. 2 has, for example, a phase shift amount d of 20 degrees, ωCR=0.36397. The passage gain |Z| at this time is 0.93, indicating a loss of 7%. The loss of 7% is 0.5 (dB). Since the loss of 0.5 (dB) of the phase shifter 2-1 illustrated in FIG. 2 is smaller than, for example, a loss of a phase shifter using a polyphase filter, the phase shifter 2-1 illustrated in FIG. 2 can reduce power consumption as compared with the phase shifter using a polyphase filter. The phase shifter using a polyphase filter has a passage loss of 6 (dB) in principle.

For example, when it is assumed that a frequency is 1 (GHz) and a resistance value R of the resistor 21 is 50 (a), a capacitance value C of the capacitor 22 is 1.15 (pF). For example, when the phase shifter 2-1 is implemented by a 0.18 (μm) complementary metal oxide semiconductor (CMOS) process, the area of the resistor 21 is about 3 (μm)×2 (μm), and the area of the capacitor 22 is about 30 (μm)×30 (μm). Therefore, the area of the phase shifter 2-1 illustrated in FIG. 2 is about 30 (μm²), and the area of the phase shifter 2-1 illustrated in FIG. 2 is smaller than the area of the phase shifter 2-1 when the phase shifter 2-1 is implemented by the distributed constant circuit.

In the phase detector illustrated in FIG. 1, the configurations of the phase shifters 2-1 to 2-4, which are components of phase shift circuit 2, are the same as each other.

In the phase detector illustrated in FIG. 1, the configurations of the first multiplier 3-1, the second multiplier 3-2, the third multiplier 3-3, the fourth multiplier 3-4, the fifth multiplier 3-5, the sixth multiplier 3-6, the seventh multiplier 3-7, and the eighth multiplier 3-8, which are components of the multiplication circuit 3, are the same as each other.

In the phase detector illustrated in FIG. 1, the configurations of the two-way dividers 5-1 to 5-8, which are some components of a phase difference detecting circuit 4, are the same as each other, and the configurations of the first addition circuit 6-1, the second addition circuit 6-2, the third addition circuit 6-3, and the fourth addition circuit 6-4 are the same as each other. In addition, the configurations of the first subtraction circuit 7-1 and the second subtraction circuit 7-2 are the same as each other.

Therefore, for example, even when a disturbance in which the temperature of an environment in which the phase detector is used changes or a disturbance in which the power supply voltage of the phase detector changes occurs, all the components in the phase shift circuit 2 change similarly, and all the components in the multiplication circuit 3 change similarly. In addition, all of some components of the phase difference detecting circuit 4 change similarly. Therefore, when a disturbance occurs, if the first subtraction signal 8·cos(ω)cos(d) after removal of the high-frequency component output from the filter 8 increases, the second subtraction signal 8·sin(ω)sin(d) output from the second subtraction circuit 7-2 also increases. In addition, if the first subtraction signal 8·cos(ω)cos(d) after removal of the high-frequency component output from the filter 8 decreases, the second subtraction signal 8·sin(ω)sin(d) output from the second subtraction circuit 7-2 also decreases.

The calculation processing circuit 9 calculates a phase difference (p between a first differential signal and a second differential signal on the basis of a ratio between the first subtraction signal 8·cos(ω)cos(d) after removal of the high-frequency component and the second subtraction signal 8·sin(ω)sin(d) as indicated in formula (1). When both the first subtraction signal 8·cos(ω)cos(d) after removal of the high-frequency component and the second subtraction signal 8·sin(ω)sin(d) increase or decrease, an influence on the ratio is small and deterioration in calculation accuracy of the phase difference (p is small as compared with a case where either one of the first subtraction signal 8·cos(ω)cos(d) after removal of the high-frequency component and the second subtraction signal 8·sin(ω)sin(d) increases or decreases.

Second Embodiment

In a second embodiment, a phase detector in which a multiplication circuit 3 includes transistors 3-1' to 3-8' as a first multiplier 3-1, a second multiplier 3-2, a third multiplier 3-3, a fourth multiplier 3-4, a fifth multiplier 3-5, a sixth multiplier 3-6, a seventh multiplier 3-7, and an eighth multiplier 3-8 will be described.

Figure 3:
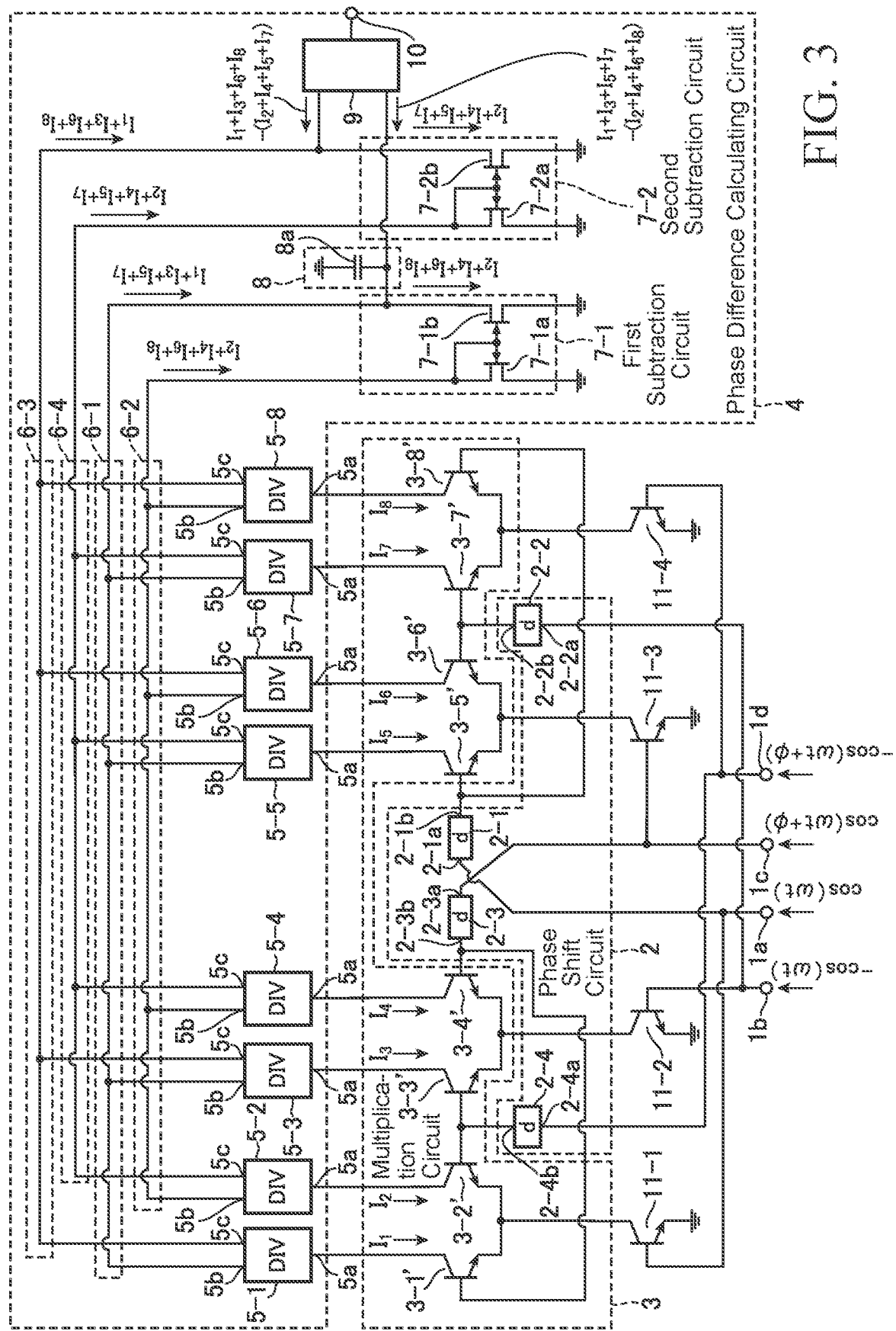
FIG. 3 is a configuration diagram illustrating a phase detector according to a second embodiment.

FIG. 3 is a configuration diagram illustrating the phase detector according to the second embodiment.

In FIG. 3, the same reference numerals as in FIG. 1 indicate the same or corresponding parts, and therefore description thereof is omitted.

Each of transistors 11-1 to 11-4 is a nonlinear element such as a bipolar transistor.

A base terminal of the transistor 11-1 is connected to a signal input terminal 1a, and a collector terminal of the transistor 11-1 is connected to an emitter terminal of each of the transistor 3-1' and the transistor 3-2'. In addition, an emitter terminal of the transistor 11-1 is grounded.

The transistor 11-1 multiplies the amplitude of a first positive-phase signal cos (ωt) input from the signal input terminal 1a by α, and outputs the first positive-phase signal α cos(ωt) obtained by multiplying the amplitude by α to the emitter terminal of each of the transistor 3-1' and the transistor 3-2'. α is a value equal to or more than 1.

A base terminal of the transistor 11-2 is connected to a signal input terminal 1b, and a collector terminal of the transistor 11-2 is connected to an emitter terminal of each of the transistor 3-3' and the transistor 3-4'. In addition, an emitter terminal of the transistor 11-2 is grounded.

The transistor 11-2 multiplies the amplitude of a first negative-phase signal −cos(ωt) input from the signal input terminal 1b by α, and outputs the first negative-phase signal −α cos(ωt) obtained by multiplying the amplitude by α to the emitter terminal of each of the transistor 3-3' and the transistor 3-4'.

A base terminal of the transistor 11-3 is connected to a signal input terminal 1c, and a collector terminal of the transistor 11-3 is connected to an emitter terminal of each of the transistor 3-5' and the transistor 3-6'. In addition, an emitter terminal of the transistor 11-3 is grounded.

The transistor 11-3 multiplies the amplitude of a second positive-phase signal cos(ωt+φ) input from the signal input terminal 1c by α, and outputs the second positive-phase signal α cos(ωt+φ) obtained by multiplying the amplitude by α to the emitter terminal of each of the transistor 3-5' and the transistor 3-6'.

A base terminal of the transistor 11-4 is connected to a signal input terminal 1d, and a collector terminal of the transistor 11-4 is connected to an emitter terminal of each of the transistor 3-7' and the transistor 3-8'. In addition, an emitter terminal of the transistor 11-4 is grounded.

The transistor 11-4 multiplies the amplitude of a second negative-phase signal −cos(ωt+φ) input from the signal input terminal 1d by α, and outputs the second negative-phase signal −α cos(ωt+φ) obtained by multiplying the amplitude by α to the emitter terminal of each of the transistor 3-7' and the transistor 3-8'.

The multiplication circuit 3 includes the transistors 3-1' to 3-8' as the first multiplier 3-1, the second multiplier 3-2, the third multiplier 3-3, the fourth multiplier 3-4, the fifth multiplier 3-5, the sixth multiplier 3-6, the seventh multiplier 3-7, and the eighth multiplier 3-8.

Each of the transistors 3-1' to 3-8' is a nonlinear element such as a bipolar transistor.

A base terminal of the transistor 3-1' is connected to each of an output terminal 2-3b of a phase shifter 2-3 and a base terminal of the transistor 3-4', and a collector terminal of the transistor 3-1' is connected to a terminal 5a described later of a two-way divider 5-1. In addition, an emitter terminal of the transistor 3-1' is connected to each of a collector terminal of the transistor 11-1 and an emitter terminal of the transistor 3-2'.

The transistor 3-1' multiplies a difference between a phase-shifted second positive-phase signal cos(ωt+φ+d) output from the phase shifter 2-3 and a first positive-phase signal α cos(ωt) output from the transistor 11-1 by a transconductance $g_n$.

When the transistor 3-1' multiplies the difference by the transconductance $g_n$, a current $I_1$ indicated in the following formula (8) flows from the two-way divider 5-1 to a collector terminal of the transistor 3-1'. As described later, the current $I_1$ corresponds to a first multiplication signal cos(ωt)×cos(ωt+φ+d) output from the first multiplier 3-1.

$$I_1 = \sum_{n=1}^{\infty} g_n(\cos(\omega t + \phi + d) - \alpha\cos(\omega t))^n \quad (8)$$

In formula (8), n represents the order of a harmonic, and n is an integer equal to or more than 2.

A base terminal of the transistor 3-2' is connected to each of an output terminal 2-4b of a phase shifter 2-4 and a base terminal of the transistor 3-3', and a collector terminal of the transistor 3-2' is connected to a terminal 5a of a two-way divider 5-2. In addition, an emitter terminal of the transistor 3-2' is connected to each of a collector terminal of the transistor 11-1 and an emitter terminal of the transistor 3-1'.

The transistor 3-2' multiplies a difference between a phase-shifted second negative-phase signal −cos(ωt+φ+d) output from the phase shifter 2-4 and a first positive-phase signal α cos(ωt) output from the transistor 11-1 by the transconductance $g_n$.

When the transistor 3-2' multiplies the difference by the transconductance $g_n$, a current $I_2$ indicated in the following formula (9) flows from the two-way divider 5-2 to a collector terminal of the transistor 3-2'. As described later, the current $I_2$ corresponds to a second multiplication signal −cos(ωt)×cos(ωt+φ+d) output from the second multiplier 3-2.

$$I_2 = \sum_{n=1}^{\infty} g_n(-\cos(\omega t + \phi + d) - \alpha\cos(\omega t))^n \quad (9)$$

A base terminal of the transistor 3-3' is connected to each of an output terminal 2-4b of the phase shifter 2-4 and a base terminal of the transistor 3-2', and a collector terminal of the transistor 3-3' is connected to a terminal 5a of a two-way divider 5-3. In addition, an emitter terminal of the transistor 3-3' is connected to each of a collector terminal of the transistor 11-2 and an emitter terminal of the transistor 3-4'.

The transistor 3-3' multiplies a difference between a phase-shifted second negative-phase signal $-\cos(\omega t+\varphi+d)$ output from the phase shifter 2-4 and a first negative-phase signal $-\alpha \cos(\omega t)$ output from the transistor 11-2 by the transconductance $g_n$.

When the transistor 3-3' multiplies the difference by the transconductance $g_n$, a current $I_3$ indicated in the following formula (10) flows from the two-way divider 5-3 to a collector terminal of the transistor 3-3'. As described later, the current $I_3$ corresponds to a third multiplication signal $\cos(\omega t)\times\cos(\omega t+\varphi+d)$ output from the third multiplier 3-3.

$$I_3 = \sum_{n=1}^{\infty} g_n(-\cos(\omega t + \emptyset + d) + \alpha\cos(\omega t))^n \tag{10}$$

A base terminal of the transistor 3-4' is connected to each of the output terminal 2-3b of the phase shifter 2-3 and a base terminal of the transistor 3-1', and a collector terminal of the transistor 3-4' is connected to a terminal 5a of a two-way divider 5-4. In addition, an emitter terminal of the transistor 3-4' is connected to each of a collector terminal of the transistor 11-2 and an emitter terminal of the transistor 3-3'.

The transistor 3-4' multiplies a difference between a phase-shifted second positive-phase signal $\cos(\omega t+\varphi+d)$ output from the phase shifter 2-3 and a first negative-phase signal $-\alpha \cos(\omega t)$ output from the transistor 11-2 by the transconductance $g_n$.

When the transistor 3-4' multiplies the difference by the transconductance $g_n$, a current $I_4$ indicated in the following formula (11) flows from the two-way divider 5-4 to a collector terminal of the transistor 3-4'. As described later, the current $I_4$ corresponds to a fourth multiplication signal $-\cos(\omega t)\times\cos(\omega t+\varphi+d)$ output from the fourth multiplier 3-4.

$$I_4 = \sum_{n=1}^{\infty} g_n(\cos(\omega t + \emptyset + d) + \alpha\cos(\omega t))^n \tag{11}$$

A base terminal of the transistor 3-5' is connected to each of an output terminal 2-1b of a phase shifter 2-1 and a base terminal of the transistor 3-8', and a collector terminal of the transistor 3-5' is connected to a terminal 5a of a two-way divider 5-5. In addition, an emitter terminal of the transistor 3-5' is connected to each of a collector terminal of the transistor 11-3 and an emitter terminal of the transistor 3-6'.

The transistor 3-5' multiplies a difference between a phase-shifted first positive-phase signal $\cos(\omega t+d)$ output from the phase shifter 2-1 and a second positive-phase signal $\alpha \cos(\omega t+\varphi)$ output from the transistor 11-3 by the transconductance $g_n$.

When the transistor 3-5' multiplies the difference by the transconductance $g_n$, a current $I_5$ indicated in the following formula (12) flows from the two-way divider 5-5 to a collector terminal of the transistor 3-5'. As described later, the current $I_5$ corresponds to a fifth multiplication signal $\cos(\omega t+d)\times\cos(\omega t+\varphi)$ output from the fifth multiplier 3-5.

$$I_5 = \sum_{n=1}^{\infty} g_n(\cos(\omega t + d) + \alpha\cos(\omega t + \emptyset))^n \tag{12}$$

A base terminal of the transistor 3-6' is connected to each of an output terminal 2-2b of a phase shifter 2-2 and a base terminal of the transistor 3-7', and a collector terminal of the transistor 3-6' is connected to a terminal 5a of a two-way divider 5-6. In addition, an emitter terminal of the transistor 3-6' is connected to each of a collector terminal of the transistor 11-3 and an emitter terminal of the transistor 3-5'.

The transistor 3-6' multiplies a difference between a phase-shifted first negative-phase signal $-\cos(\omega t+d)$ output from the phase shifter 2-2 and a second positive-phase signal $\alpha \cos(\omega t+\varphi)$ output from the transistor 11-3 by the transconductance $g_n$.

When the transistor 3-6' multiplies the difference by the transconductance $g_n$, a current $I_6$ indicated in the following formula (13) flows from the two-way divider 5-6 to a collector terminal of the transistor 3-6'. As described later, the current $I_6$ corresponds to a sixth multiplication signal $-\cos(\omega t+d)\times\cos(\omega t+\varphi)$ output from the sixth multiplier 3-6.

$$I_6 = \sum_{n=1}^{\infty} g_n(-\cos(\omega t + d) - \alpha\cos(\omega t + \emptyset))^n \tag{13}$$

A base terminal of the transistor 3-7' is connected to each of the output terminal 2-2b of the phase shifter 2-2 and a base terminal of the transistor 3-6', and a collector terminal of the transistor 3-7' is connected to a terminal 5a of a two-way divider 5-7. In addition, an emitter terminal of the transistor 3-7' is connected to each of a collector terminal of the transistor 11-4 and an emitter terminal of the transistor 3-8'.

The transistor 3-7' multiplies a difference between a phase-shifted first negative-phase signal $-\cos(\omega t+d)$ output from the phase shifter 2-2 and a second negative-phase signal $-\alpha \cos(\omega t+\varphi)$ output from the transistor 11-4 by the transconductance $g_n$.

When the transistor 3-7' multiplies the difference by the transconductance $g_n$, a current $I_7$ indicated in the following formula (14) flows from the two-way divider 5-7 to a collector terminal of the transistor 3-7'. As described later, the current $I_7$ corresponds to a seventh multiplication signal $\cos(\omega t+d)\times\cos(\omega t+\varphi)$ output from the seventh multiplier 3-7.

$$I_7 = \sum_{n=1}^{\infty} g_n(-\cos(\omega t + d) + \alpha\cos(\omega t + \emptyset))^n \tag{14}$$

A base terminal of the transistor 3-8' is connected to each of the output terminal 2-1b of the phase shifter 2-1 and a base terminal of the transistor 3-5', and a collector terminal of the transistor 3-8' is connected to a terminal 5a of a two-way divider 5-8. In addition, an emitter terminal of the transistor 3-8' is connected to each of a collector terminal of the transistor 11-4 and an emitter terminal of the transistor 3-7'.

The transistor 3-8' multiplies a difference between a phase-shifted first positive-phase signal $\cos(\omega t+d)$ output from the phase shifter 2-1 and a second negative-phase signal $-\alpha \cos(\omega t+\varphi)$ output from the transistor 11-4 by the transconductance $g_n$.

When the transistor 3-8' multiplies the difference by the transconductance $g_n$, a current $I_8$ indicated in the following formula (15) flows from the two-way divider 5-8 to a collector terminal of the transistor 3-8'. As described later, the current $I_8$ corresponds to an eighth multiplication signal $-\cos(\omega t+d) \times \cos(\omega t+\varphi)$ output from the eighth multiplier 3-8.

$$I_8 = \sum_{n=1}^{\infty} g_n (\cos(\omega t + d) + \alpha \cos(\omega t + \emptyset))^n \tag{15}$$

The terminal 5a of the two-way divider 5-1 is connected to a collector terminal of the transistor 3-1', a terminal 5b of the two-way divider 5-1 is connected to a first addition circuit 6-1, and a terminal 5c of the two-way divider 5-1 is connected to a third addition circuit 6-3.

The terminal 5a of the two-way divider 5-2 is connected to a collector terminal of the transistor 3-2', a terminal 5b of the two-way divider 5-2 is connected to a second addition circuit 6-2, and a terminal 5c of the two-way divider 5-2 is connected to a fourth addition circuit 6-4.

The terminal 5a of the two-way divider 5-3 is connected to a collector terminal of the transistor 3-3', a terminal 5b of the two-way divider 5-3 is connected to the first addition circuit 6-1, and a terminal 5c of the two-way divider 5-3 is connected to the third addition circuit 6-3.

The terminal 5a of the two-way divider 5-4 is connected to a collector terminal of the transistor 3-4', a terminal 5b of the two-way divider 5-4 is connected to the second addition circuit 6-2, and a terminal 5c of the two-way divider 5-4 is connected to the fourth addition circuit 6-4.

The terminal 5a of the two-way divider 5-5 is connected to a collector terminal of the transistor 3-5', a terminal 5b of the two-way divider 5-5 is connected to the first addition circuit 6-1, and a terminal 5c of the two-way divider 5-5 is connected to the fourth addition circuit 6-4.

The terminal 5a of the two-way divider 5-6 is connected to a collector terminal of the transistor 3-6', a terminal 5b of the two-way divider 5-6 is connected to the second addition circuit 6-2, and a terminal 5c of the two-way divider 5-6 is connected to the third addition circuit 6-3.

The terminal 5a of the two-way divider 5-7 is connected to a collector terminal of the transistor 3-7', a terminal 5b of the two-way divider 5-7 is connected to the first addition circuit 6-1, and a terminal 5c of the two-way divider 5-7 is connected to the fourth addition circuit 6-4.

The terminal 5a of the two-way divider 5-8 is connected to a collector terminal of the transistor 3-8', a terminal 5b of the two-way divider 5-8 is connected to the second addition circuit 6-2, and a terminal 5c of the two-way divider 5-8 is connected to the third addition circuit 6-3.

Figure 4:
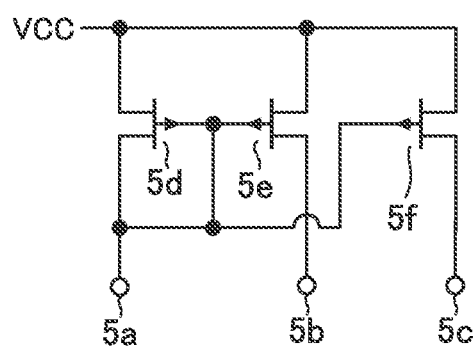
FIG. 4 is a configuration diagram illustrating two-way dividers 5-1 to 5-8 of the phase detector according to the second embodiment.

FIG. 4 is a configuration diagram illustrating the two-way dividers 5-1 to 5-8 of the phase detector according to the second embodiment.

Each of the two-way dividers 5-1 to 5-8 includes a transistor 5d, a transistor 5e, and a transistor 5f, and forms a current mirror circuit.

Therefore, each of the two-way dividers 5-1 to 5-8 outputs a current having the same magnitude as a current output from the terminal 5a from each of the terminal 5b and the terminal 5c.

The transistor 5d is, for example, a field effect transistor (FET).

A gate terminal of the transistor 5d is connected to each of the terminal 5a, a gate terminal of the transistor 5e, and a gate terminal of the transistor 5f. A voltage VCC is applied to a drain terminal of the transistor 5d.

A source terminal of the transistor 5d is connected to each of the terminal 5a, a gate terminal of the transistor 5d, a gate terminal of the transistor 5e, and a gate terminal of the transistor 5f.

The transistor 5e is, for example, an FET.

A gate terminal of the transistor 5e is connected to each of the terminal 5a, a gate terminal of the transistor 5d, and a gate terminal of the transistor 5f. A voltage VCC is applied to a drain terminal of the transistor 5e.

A source terminal of the transistor 5e is connected to the terminal 5b.

The transistor 5f is, for example, an FET.

A gate terminal of the transistor 5f is connected to each of the terminal 5a, a gate terminal of the transistor 5d, and a gate terminal of the transistor 5e. A voltage VCC is applied to a drain terminal of the transistor 5f.

A source terminal of the transistor 5f is connected to the terminal 5c.

A first subtraction circuit 7-1 includes a transistor 7-1a and a transistor 7-1b.

The transistor 7-1a is, for example, an FET.

A gate terminal of the transistor 7-1a is connected to each of the second addition circuit 6-2, a gate terminal of the transistor 7-1b, and a drain terminal of the transistor 7-1a.

The drain terminal of the transistor 7-1a is connected to each of the second addition circuit 6-2, the gate terminal of the transistor 7-1a, and the gate terminal of the transistor 7-1b.

A source terminal of the transistor 7-1a is grounded.

The transistor 7-1b is, for example, an FET.

The gate terminal of the transistor 7-1b is connected to each of the second addition circuit 6-2, the gate terminal of the transistor 7-1a, and the drain terminal of the transistor 7-1a.

The drain terminal of the transistor 7-1b is connected to each of the first addition circuit 6-1 and a filter 8.

A source terminal of the transistor 7-1b is grounded.

A second subtraction circuit 7-2 includes a transistor 7-2a and a transistor 7-2b.

The transistor 7-2a is, for example, an FET.

A gate terminal of the transistor 7-2a is connected to each of the fourth addition circuit 6-4, a gate terminal of the transistor 7-2b, and a drain terminal of the transistor 7-2a.

The drain terminal of the transistor 72a is connected to each of the fourth addition circuit 6-4, the gate terminal of the transistor 7-2a, and the gate terminal of the transistor 7-2b.

A source terminal of the transistor 7-2a is grounded.

The transistor 7-2b is, for example, an FET.

The gate terminal of the transistor 7-2b is connected to each of the fourth addition circuit 6-4, the gate terminal of the transistor 7-2a, and the drain terminal of the transistor 7-2a.

A drain terminal of the transistor 7-2b is connected to each of the third addition circuit 6-3 and a calculation processing circuit 9.

A source terminal of the transistor 7-2b is grounded.

The filter 8 is implemented by a capacitor 8a.

Similarly to the first embodiment, the filter 8 removes a high-frequency component included in a first subtraction signal output from the first subtraction circuit 7-1.

The filter 8 outputs the first subtraction signal after removal of the high-frequency component to the calculation processing circuit 9.

One end of the capacitor 8a is connected to a signal line connecting an output side of the first subtraction circuit 7-1 to an input side of the calculation processing circuit 9, and the other end of the capacitor 8a is grounded.

Next, an operation of the phase detector illustrated in FIG. 3 will be described.

When a first positive-phase signal $\cos(\omega t)$ is input from the signal input terminal 1a to the transistor 11-1, the transistor 11-1 multiplies the amplitude of the first positive-phase signal $\cos(\omega t)$ by $\alpha$.

The transistor 11-1 outputs the first positive-phase signal $\alpha \cos(\omega t)$ obtained by multiplying the amplitude by $\alpha$ to an emitter terminal of each of the transistor 3-1' and the transistor 3-2'.

When a first negative-phase signal $-\cos(\omega t)$ is input from the signal input terminal 1b to the transistor 11-2, the transistor 11-2 multiplies the amplitude of the first negative-phase signal $-\cos(\omega t)$ by $\alpha$.

The transistor 11-2 outputs the first negative-phase signal $-\alpha \cos(\omega t)$ obtained by multiplying the amplitude by $\alpha$ to an emitter terminal of each of the transistor 3-3' and the transistor 3-4'.

When a second positive-phase signal $\cos(\omega t+\varphi)$ is input from the signal input terminal 1c to the transistor 11-3, the transistor 11-3 multiplies the amplitude of the second positive-phase signal $\cos(\omega t+\varphi)$ by $\alpha$.

The transistor 11-3 outputs the second positive-phase signal $\alpha \cos(\omega t+\varphi)$ obtained by multiplying the amplitude by $\alpha$ to an emitter terminal of each of the transistor 3-5' and the transistor 3-6'.

When a second negative-phase signal $-\cos(\omega t+\varphi)$ is input from the signal input terminal 1d to the transistor 11-4, the transistor 11-4 multiplies the amplitude of the second negative-phase signal $-\cos(\omega t+\varphi)$ by $\alpha$.

The transistor 11-4 outputs the second negative-phase signal $-\alpha \cos(\omega t+\varphi)$ obtained by multiplying the amplitude by $\alpha$ to an emitter terminal of each of the transistor 3-7' and the transistor 3-8'.

A phase-shifted second positive-phase signal $\cos(\omega t+\varphi+d)$ output from the phase shifter 2-3 and a first positive-phase signal $\alpha \cos(\omega t)$ output from the transistor 11-1 are input to the transistor 3-1'.

The transistor 3-1' subtracts the first positive-phase signal $\alpha \cos(\omega t)$ from the phase-shifted second positive-phase signal $\cos(\omega t+\varphi+d)$.

The transistor 3-1' multiplies the subtracted result $\cos(\omega t+\varphi+d)-\alpha \cos(\omega t)$ by the transconductance $g_n$.

When the transistor 3-1' multiplies the subtracted result by the transconductance $g_n$, the current $I_1$ indicated in formula (8) flows from the two-way divider 5-1 to a collector terminal of the transistor 3-1'.

A phase-shifted second negative-phase signal $-\cos(\omega t+\varphi+d)$ output from the phase shifter 2-4 and a first positive-phase signal $\alpha \cos(\omega t)$ output from the transistor 11-1 are input to the transistor 3-2'.

The transistor 3-2' subtracts the first positive-phase signal $\alpha \cos(\omega t)$ from the phase-shifted second negative-phase signal $-\cos(\omega t+\varphi+d)$.

The transistor 3-2' multiplies the subtracted result $-\cos(\omega t+\varphi+d)-\alpha \cos(\omega t)$ by the transconductance $g_n$.

When the transistor 3-2' multiplies the subtracted result by the transconductance $g_n$, the current $I_2$ indicated in formula (9) flows from the two-way divider 5-2 to a collector terminal of the transistor 3-2'.

A phase-shifted second negative-phase signal $-\cos(\omega t+\varphi+d)$ output from the phase shifter 2-4 and a first negative-phase signal $-\alpha \cos(\omega t)$ output from the transistor 11-2 are input to the transistor 3-3'.

The transistor 3-3' subtracts the first negative-phase signal $-\alpha \cos(\omega t)$ from the phase-shifted second negative-phase signal $-\cos(\omega t+\varphi+d)$.

The transistor 3-3' multiplies the subtracted result $-\cos(\omega t+\varphi+d)+\alpha \cos(\omega t)$ by the transconductance $g_n$.

When the transistor 3-3' multiplies the subtracted result by the transconductance $g_n$, the current $I_3$ indicated in formula (10) flows from the two-way divider 5-3 to a collector terminal of the transistor 3-3'.

A phase-shifted second positive-phase signal $\cos(\omega t+\varphi+d)$ output from the phase shifter 2-3 and a first negative-phase signal $-\alpha \cos(\omega t)$ output from the transistor 11-2 are input to the transistor 3-4'.

The transistor 3-4' subtracts the first negative-phase signal $-\alpha \cos(\omega t)$ from the phase-shifted second positive-phase signal $\cos(\omega t+\varphi+d)$.

The transistor 3-4' multiplies the subtracted result $\cos(\omega t+\varphi+d)+\alpha \cos(\omega t)$ by the transconductance $g_n$.

When the transistor 3-4' multiplies the subtracted result by the transconductance $g_n$, the current $I_4$ indicated in formula (11) flows from the two-way divider 5-4 to a collector terminal of the transistor 3-4'.

A phase-shifted first positive-phase signal $\cos(\omega t+d)$ output from the phase shifter 2-1 and a second positive-phase signal $\alpha \cos(\omega t+\varphi)$ output from the transistor 11-3 are input to the transistor 3-5'.

The transistor 3-5' subtracts the second positive-phase signal $\alpha \cos(\omega t+\varphi)$ from the phase-shifted first positive-phase signal $\cos(\omega t+d)$.

The transistor 3-5' multiplies the subtracted result $\cos(\omega t+d)-\alpha \cos(\omega t+\varphi)$ by the transconductance $g_n$.

When the transistor 3-5' multiplies the subtracted result by the transconductance $g_n$, the current $I_5$ indicated in formula (12) flows from the two-way divider 5-5 to a collector terminal of the transistor 3-5'.

A phase-shifted first negative-phase signal $-\cos(\omega t+d)$ output from the phase shifter 2-2 and a second positive-phase signal $\alpha \cos(\omega t+\varphi)$ output from the transistor 11-3 are input to the transistor 3-6'.

The transistor 3-6' subtracts the second positive-phase signal $\alpha \cos(\omega t+\varphi)$ from the phase-shifted first negative-phase signal $-\cos(\omega t+d)$.

The transistor 3-6' multiplies the subtracted result $-\cos(\omega t+d)-\alpha \cos(\omega t+\varphi)$ by the transconductance $g_n$.

When the transistor 3-6' multiplies the subtracted result by the transconductance $g_n$, the current $I_6$ indicated in formula (13) flows from the two-way divider 5-6 to a collector terminal of the transistor 3-6'.

A phase-shifted first negative-phase signal $-\cos(\omega t+d)$ output from the phase shifter 2-2 and a second negative-phase signal $-\alpha \cos(\omega t+\varphi)$ output from the transistor 11-4 are input to the transistor 3-7'.

The transistor 3-7' subtracts the second negative-phase signal $-\alpha \cos(\omega t+\varphi)$ from the phase-shifted first negative-phase signal $-\cos(\omega t+d)$.

The transistor 3-7' multiplies the subtracted result $-\cos(\omega t+d)+\alpha \cos(\omega t+\varphi)$ by the transconductance $g_n$.

When the transistor 3-7' multiplies the subtracted result by the transconductance $g_n$, the current $I_7$ indicated in formula (14) flows from the two-way divider 5-7 to a collector terminal of the transistor 3-7'.

A phase-shifted first positive-phase signal $\cos(\omega t+d)$ output from the phase shifter 2-1 and a second negative-phase signal $-\alpha \cos(\omega t+\varphi)$ output from the transistor 11-4 are input to the transistor 3-8'.

The transistor 3-8' subtracts the second negative-phase signal $-\alpha \cos(\omega t+\varphi)$ from the phase-shifted first positive-phase signal $\cos(\omega t+d)$.

The transistor 3-8' multiplies the subtracted result $\cos(\omega t+d)+\alpha \cos(\omega t+\varphi)$ by the transconductance $g_n$.

When the transistor 3-8' multiplies the subtracted result by the transconductance $g_n$, the current $I_7$ indicated in formula (15) flows from the two-way divider 5-8 to a collector terminal of the transistor 3-8'.

Among a plurality of harmonic components included in each of the current $I_1$, the current $I_2$, the current $I_3$, the current $I_4$, the current $I_5$, the current $I_6$, the current $I_7$, and the current $I_8$, odd-order (1, 3, 5, . . . ) harmonic components cancel each other in a differential signal. Since the strongest component among even-order (2, 4, 6, . . . ) harmonic components is a second-order harmonic component, the second-order harmonic component is dominant among the even-order (2, 4, 6, . . . ) harmonic components.

The second-order harmonic component is represented by $(x\pm y)^2$ and includes squared component terms ($x^2$, $y^2$) and a term represented by $2xy$. In the differential signal, since the squared component terms ($x^2$, $y^2$) cancel each other, the second-order harmonic component is substantially equal to the term represented by $2xy$.

Therefore, each of the current $I_1$, the current $I_2$, the current $I_3$, the current $I_4$, the current $I_5$, the current $I_6$, the current $I_7$, and the current $I_8$ is approximated as in formulas (16) to (23).

$$I_1 \approx -2\alpha \cos(\omega t+\varnothing+d)\cdot\cos(\omega t) \quad (16)$$

$$I_2 \approx 2\alpha \cos(\omega t+\varnothing+d)\cdot\cos(\omega t) \quad (17)$$

$$I_3 \approx -2\alpha \cos(\omega t+\varnothing+d)\cdot\cos(\omega t) \quad (18)$$

$$I_4 \approx 2\alpha \cos(\omega t+\varnothing+d)\cdot\cos(\omega d) \quad (19)$$

$$I_5 \approx -2\alpha \cos(\omega t+d)\cdot\cos(\omega t+\varnothing) \quad (20)$$

$$I_6 \approx 2\alpha \cos(\omega t+d)\cdot\cos(\omega t+\varnothing) \quad (21)$$

$$I_7 \approx -2\alpha \cos(\omega t+d)\cdot\cos(\omega t+\varnothing) \quad (22)$$

$$I_8 \approx 2\alpha \cos(\omega d+d)\cdot\cos(\omega t+\varnothing) \quad (23)$$

Here, since a direction in which the current $I_1$ flows from the two-way divider 5-1 to the first transistor 3-1' is positive, and the sign of the current $I_1$ indicated in formula (16) is "−", there is no inconsistency in sign between the first multiplication signal $\cos(\omega t)\times\cos(\omega t+\varphi+d)$ whose sign is "+" and the current $I_1$. In addition, the absolute value of the current $I_1$ indicated in formula (16) is proportional to the absolute value of the first multiplication signal $\cos(\omega t)\times\cos(\omega t+\varphi+d)$. Therefore, the current $I_1$ corresponds to the first multiplication signal $\cos(\omega t)\times\cos(\omega t+\varphi+d)$.

Since a direction in which the current $I_2$ flows from the two-way divider 5-2 to the second transistor 3-2' is positive, and the sign of the current $I_2$ indicated in formula (17) is "+", there is no inconsistency in sign between the second multiplication signal $-\cos(\omega t)\times\cos(\omega t+\varphi+d)$ whose sign is "−" and the current $I_2$. In addition, the absolute value of the current $I_2$ indicated in formula (17) is proportional to the absolute value of the second multiplication signal $-\cos(\omega t)\times\cos(\omega t+\varphi+d)$. Therefore, the current $I_2$ corresponds to the second multiplication signal $-\cos(\omega t)\times\cos(\omega t+\varphi+d)$.

As for each of the current $I_3$, the current $I_5$, and the current $I_7$, the current $I_3$ corresponds to the third multiplication signal, the current $I_5$ corresponds to the fifth multiplication signal, and the current $I_7$ corresponds to the seventh multiplication signal for a similar reason to the current $I_1$.

As for each of the current $I_4$, the current $I_6$, and the current $I_8$, the current $I_4$ corresponds to the fourth multiplication signal, the current $I_6$ corresponds to the sixth multiplication signal, and the current $I_8$ corresponds to the eighth multiplication signal for a similar reason to the current $I_2$.

The two-way divider 5-1 outputs the same current $I_1$ as the current $I_1$ output from the terminal 5a to a collector terminal of the transistor 3-1' from the terminal 5b to the first addition circuit 6-1, and outputs the current $I_1$ from the terminal 5c to the third addition circuit 6-3.

The two-way divider 5-2 outputs the same current $I_2$ as the current $I_2$ output from the terminal 5a to a collector terminal of the transistor 3-2' from the terminal 5b to the second addition circuit 6-2, and outputs the current $I_2$ from the terminal 5c to the fourth addition circuit 6-4.

The two-way divider 5-3 outputs the same current $I_3$ as the current $I_3$ output from the terminal 5a to a collector terminal of the transistor 3-3' from the terminal 5b to the first addition circuit 6-1, and outputs the current $I_3$ from the terminal 5c to the third addition circuit 6-3.

The two-way divider 5-4 outputs the same current $I_4$ as the current $I_4$ output from the terminal 5a to a collector terminal of the transistor 3-4' from the terminal 5b to the second addition circuit 6-2, and outputs the current $I_4$ from the terminal 5c to the fourth addition circuit 6-4.

The two-way divider 5-5 outputs the same current $I_5$ as the current $I_5$ output from the terminal 5a to a collector terminal of the transistor 3-5' from the terminal 5b to the first addition circuit 6-1, and outputs the current $I_5$ from the terminal 5c to the fourth addition circuit 6-4.

The two-way divider 5-6 outputs the same current $I_6$ as the current $I_6$ output from the terminal 5a to a collector terminal of the transistor 3-6' from the terminal 5b to the second addition circuit 6-2, and outputs the current $I_6$ from the terminal 5c to the third addition circuit 6-3.

The two-way divider 5-7 outputs the same current $I_7$ as the current $I_7$ output from the terminal 5a to a collector terminal of the transistor 3-7' from the terminal 5b to the first addition circuit 6-1, and outputs the current $I_7$ from the terminal 5c to the fourth addition circuit 6-4.

The two-way divider 5-8 outputs the same current $I_8$ as the current $I_8$ output from the terminal 5a to a collector terminal of the transistor 3-8' from the terminal 5b to the second addition circuit 6-2, and outputs the current $I_8$ from the terminal 5c to the third addition circuit 6-3.

Since the current $I_1$, the current $I_3$, the current $I_5$, and the current $I_7$ are added in the first addition circuit 6-1, the current of $I_1+I_3+I_5+I_7$ flows through a drain terminal of the transistor 7-1b in the first subtraction circuit 7-1.

$$(I_1+I_3+I_5+I_7)=-2\alpha \cos(\omega t+\varnothing+d)\cdot\cos(\omega t)-2\alpha \cos(\omega t+\varnothing+d)\cdot\cos(\omega t)-2\alpha \cos(\omega t+d)\cdot\cos(\omega t+\varnothing)-2\alpha \cos(\omega t+d)\cdot\cos(\omega t+\varnothing)=-4\alpha(\cos(\omega t+\varnothing+d)\cdot\cos(\omega t)+\cos(\omega t+d)\cdot\cos(\omega t+\varnothing)) \quad (24)$$

Since the current $I_2$, the current $I_4$, the current $I_6$, and the current $I_8$ are added in the second addition circuit 6-2, the current of $I_2+I_4+I_6+I_8$ flows through each of a drain terminal of the transistor 7-1a, a gate terminal of the transistor 7-1a, and a gate terminal of the transistor 7-1b in the first subtraction circuit 7-1.

$(I_2+I_4+I_6+I_8)=2\alpha\cos(\omega t+\emptyset+d)\cdot\cos(\omega t)+2\alpha\cos(\omega t+\emptyset+d)\cdot\cos(\omega t)+2\alpha\cos(\omega t+d)\cdot\cos(\omega t+\emptyset)+2\alpha\cos(\omega t+d)\cdot\cos(\omega t+\emptyset)=4\alpha(\cos(\omega t+\emptyset+d)\cdot\cos(\omega t)+\cos(\omega t+d)\cdot\cos(\omega t+\emptyset))$ (25)

Since the current $I_1$, the current $I_3$, the current $I_6$, and the current $I_8$ are added in the third addition circuit 6-3, the current of $I_1+I_3+I_6+I_8$ flows through a drain terminal of the transistor 7-2b in the second subtraction circuit 7-2.

$(I_1+I_3+I_6+I_8)=2\alpha\cos(\omega t+\emptyset+d)\cdot\cos(\omega t)-2\alpha\cos(\omega t+\emptyset+d)\cdot\cos(\omega t)+2\alpha\cos(\omega t+d)\cdot\cos(\omega t+\emptyset)+2\alpha\cos(\omega t+d)\cdot\cos(\omega t+\emptyset)=-4\alpha(\cos(\omega t+\emptyset+d)\cdot\cos(\omega t)-\cos(\omega t+d)\cdot\cos(\omega t+\emptyset))$ (26)

Since the current $I_2$, the current $I_4$, the current $I_5$, and the current $I_7$ are added in the fourth addition circuit 6-4, the current of $I_2+I_4+I_5+I_7$ flows through each of a drain terminal of the transistor 7-2a, a gate terminal of the transistor 7-2a, and a gate terminal of the transistor 7-2b in the second subtraction circuit 7-2.

$(I_2+I_4+I_5+I_7)=2\alpha\cos(\omega t+\emptyset+d)\cdot\cos(\omega t)+2\alpha\cos(\omega t+\emptyset+d)\cdot\cos(\omega t)-2\alpha\cos(\omega t+d)\cdot\cos(\omega t+\emptyset)-2\alpha\cos(\omega t+d)\cdot\cos(\omega t+\emptyset)=4\alpha(\cos(\omega t+\emptyset+d)\cdot\cos(\omega t)-\cos(\omega t+d)\cdot\cos(\omega t+\emptyset))$ (27)

The first subtraction circuit 7-1 subtracts the current of $I_2+I_4+I_6+I_8$ from the current of $I_1+I_3+I_5+I_7$.

A current $I_{OUT1}$ indicating a result of the subtraction by the first subtraction circuit 7-1 flows through the filter 8.

$$\begin{aligned}I_{OUT1} &= -8\alpha(\cos(\omega t+\emptyset+d)\cdot\cos(\omega t)+\cos(\omega t+d)\cdot\cos(\omega t+\emptyset)) \\ &= -4\alpha(\cos(2\omega t+\emptyset+d)+\cos(\emptyset+d)+\cos(2\omega t+\emptyset+d)+\cos(\emptyset-d)) \\ &= -4\alpha(2\cos(2\omega t+\emptyset+d)+\cos(\emptyset+d)+\cos(\emptyset-d)) \\ &= -4\alpha(2\cos(2\omega t+\emptyset+d)+2\cos(\emptyset)\cos(d)) \\ &= -8\alpha(\cos(2\omega t+\emptyset+d)+\cos(\emptyset)\cos(d))\end{aligned}$$ (28)

The filter 8 removes $-8\alpha\cos(2\omega t+\varphi+d)$, which is a second-order high-frequency component, from the current $I_{OUT1}$ indicated in formula (28). Therefore, a current of $I'_{OUT1}=-8\alpha\cos(\omega)\cos(d)$ flows from the calculation processing circuit 9 to the filter 8.

The second subtraction circuit 7-2 subtracts the current of $I_2+I_4+I_5+I_7$ from the current of $I_1+I_3+I_6+I_8$.

A current $I_{OUT2}$ indicating a result of the subtraction by the second subtraction circuit 7-2 flows from the calculation processing circuit 9 to the second subtraction circuit 7-2.

$$\begin{aligned}I_{OUT2} &= -8\alpha(\cos(\omega t+\emptyset+d)\cdot\cos(\omega t)-\cos(\omega t+d)\cdot\cos(\omega t+\emptyset)) \\ &= -4\alpha(\cos(2\omega t+\emptyset+d)+\cos(\emptyset+d)-\cos(2\omega t+\emptyset+d)-\cos(\emptyset-d)) \\ &= -4\alpha(\cos(\emptyset+d)-\cos(\emptyset-d)) \\ &= -4\alpha(\cos(\emptyset)\cos(d)-\sin(\emptyset)\sin(d)-(\cos(\emptyset)\cos(d)+\sin(\emptyset)\sin(d))) \\ &= -8\alpha\sin(\emptyset)\sin(d)\end{aligned}$$ (29)

The calculation processing circuit 9 calculates a phase difference φ between a first differential signal and a second differential signal from the current $I_{OUT1}$, and the current $I_{OUT2}$ as indicated in the following formula (30).

$$\begin{aligned}\emptyset &= \tan^{-1}\left(\frac{I_{OUT2}}{I'_{OUT1}}\times\frac{\cos(d)}{\sin(d)}\right) \\ &= \tan^{-1}\left(\frac{-8\cdot\sin(\emptyset)\sin(d)}{-8\cdot\cos(\emptyset)\cos(d)}\times\frac{\cos(d)}{\sin(d)}\right)\end{aligned}$$ (30)

Since the phase shift amount d of the phase shift circuit 2 is a predetermined value, each of cos(d) and sin(d) is also a predetermined value. For example, each of cos(d) and sin(d) may be stored in an internal memory of the calculation processing circuit 9, or may be provided from the outside of the phase detector illustrated in FIG. 3.

The calculation processing circuit 9 outputs the calculated phase difference φ to the signal output terminal 10.

In the calculation formula of the phase difference φ indicated in formula (30), with a phase shift amount d in which cos(d) or sin(d) is not zero, the phase difference φ between a first differential signal and a second differential signal can be calculated. The phase shift amount d in which cos(d) or sin(d) is not zero is a phase shift amount other than 0 degrees, 90 degrees, 180 degrees, or 270 degrees.

Therefore, in the phase detector illustrated in FIG. 3, a range in which the phase difference φ can be detected is not limited to a range of 180 degrees similarly to the phase detector illustrated in FIG. 1.

In the phase detector illustrated in FIG. 3, the phase shift amount is d.

For example, when the phase shift amount satisfies d=45 degrees, the first subtraction signal after removal of the high-frequency component output from the filter 8 is 8·cos(ω)cos(45). In addition, the second subtraction signal output from the second subtraction circuit 7-2 is 8·sin(ω)sin(45).

The phase difference φ calculated by the calculation processing circuit 9 is indicated by the following formula (31).

$$\begin{aligned}\emptyset &= \tan^{-1}\left(\frac{-8\cdot\sin(\emptyset)\sin(45)}{-8\cdot\cos(\emptyset)\cos(45)}\times\frac{\cos(45)}{\sin(45)}\right) \\ &= \tan^{-1}\left(\frac{-8\cdot\sin(\emptyset)\sin(45)}{-8\cdot\cos(\emptyset)\cos(45)}\right)\end{aligned}$$ (31)

When the phase shift amount satisfies d=45 degrees, the calculation processing circuit 9 does not need to multiply the term cos(d)/sin(d) as indicated by formula (31), and therefore the circuit of the calculation processing circuit 9 can be simplified as compared with a case of d≠45 degrees.

In the phase detector illustrated in FIG. 3, the multiplication circuit 3 includes the transistors 3-1' to 3-8', which are nonlinear elements, as the first multiplier 3-1, the second multiplier 3-2, the third multiplier 3-3, the fourth multiplier 3-4, the fifth multiplier 3-5, the sixth multiplier 3-6, the seventh multiplier 3-7, and the eighth multiplier 3-8.

Each of the first multiplier 3-1, the second multiplier 3-2, the third multiplier 3-3, the fourth multiplier 3-4, the fifth multiplier 3-5, the sixth multiplier 3-6, the seventh multiplier 3-7, and the eighth multiplier 3-8 only needs to be a nonlinear element, and may be, for example, a three-terminal device such as an FET or a two-terminal device such as a diode.

In the phase detector illustrated in FIG. 3, the phase shifter 2-1 is connected between the signal input terminal 1a and each of a gate terminal of the transistor 3-5' and a gate terminal of the transistor 3-8', and the phase shifter 2-2 is connected between the signal input terminal 1b and each of a gate terminal of the transistor 3-6' and a gate terminal of the transistor 3-7'. In addition, the phase shifter 2-3 is connected between the signal input terminal 1c and each of a gate terminal of the transistor 3-1' and a gate terminal of the transistor 3-4', and the phase shifter 2-4 is connected between the signal input terminal 1d and each of a gate terminal of the transistor 3-2' and a gate terminal of the transistor 3-3'.

Figure 5:
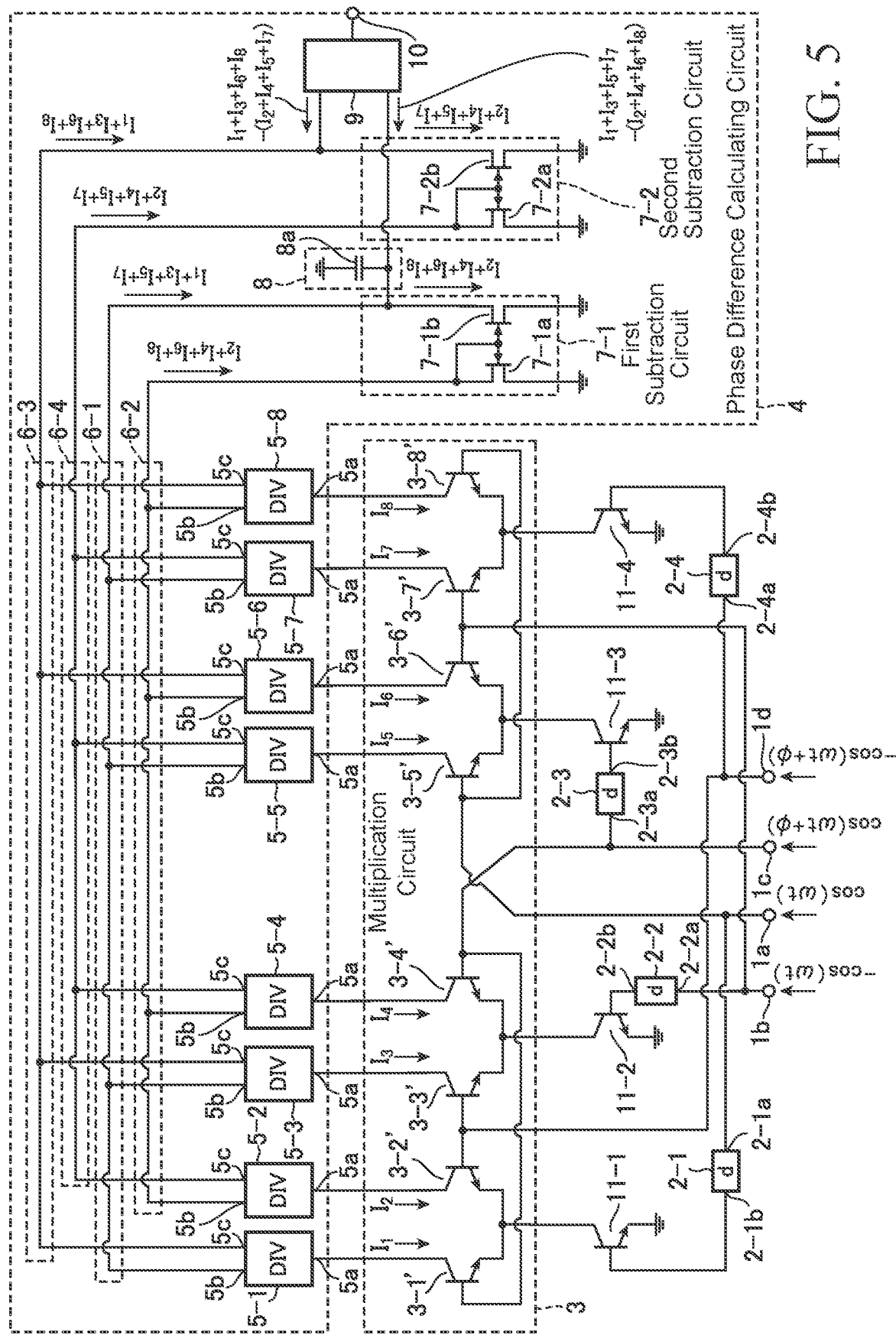
FIG. 5 is a configuration diagram illustrating another phase detector according to the second embodiment.

However, this is merely an example, and as illustrated in FIG. 5, the phase shifter 2-1 may be connected between the signal input terminal 1a and a gate terminal of the transistor 11-1, and the phase shifter 2-2 may be connected between the signal input terminal 1b and a gate terminal of the transistor 11-2. In addition, the phase shifter 2-3 may be connected between the signal input terminal 1c and a gate terminal of the transistor 11-3, and the phase shifter 2-4 may be connected between the signal input terminal 1d and a gate terminal of the transistor 11-4.

FIG. 5 is a configuration diagram illustrating another phase detector according to the second embodiment.

Third Embodiment

In a third embodiment, a phase detector in which each of phase shifters 2-1 to 2-4 includes a high-pass filter including a resistor and a capacitor will be described.

Figure 6:
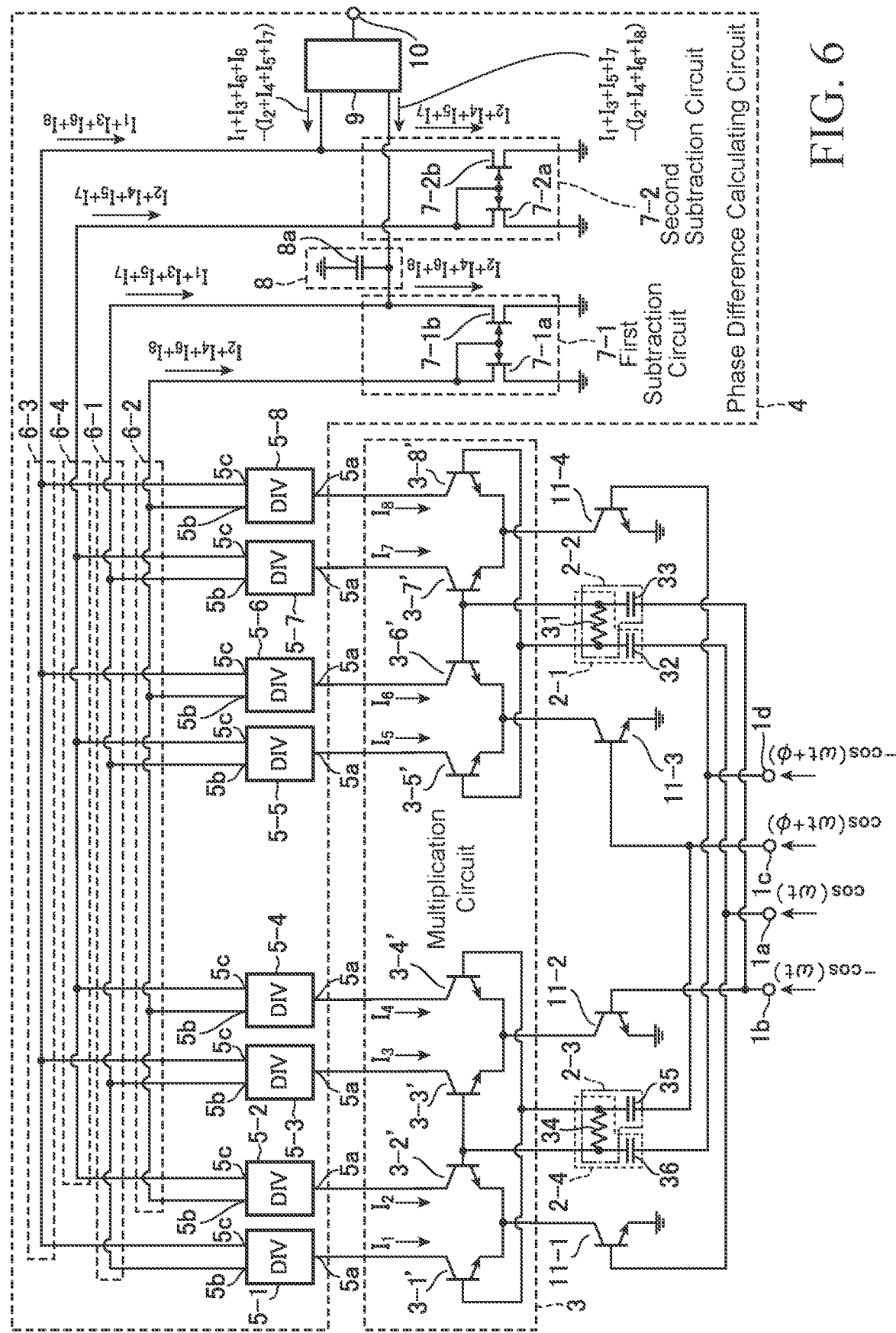
FIG. 6 is a configuration diagram illustrating a phase detector according to a third embodiment.

FIG. 6 is a configuration diagram illustrating the phase detector according to the third embodiment. In FIG. 6, the same reference numerals as in FIGS. 1 and 3 indicate the same or corresponding parts, and therefore description thereof is omitted.

The phase shifter 2-1 includes a high-pass filter including a resistor 31 and a capacitor 32.

The phase shifter 2-2 includes a high-pass filter including the resistor 31 and a capacitor 33.

The resistor 31 is included in both the phase shifter 2-1 and the phase shifter 2-2.

One end of the resistor 31 is connected to each of a gate terminal of a transistor 3-5', a gate terminal of a transistor 3-8', and the other end of the capacitor 32, and the other end of the resistor 31 is connected to each of a gate terminal of a transistor 3-6', a gate terminal of a transistor 3-7', and the other end of the capacitor 33.

One end of the capacitor 32 is connected to each of a signal input terminal 1a and a gate terminal of a transistor 11-1, and the other end of the capacitor 32 is connected to one end of the resistor 31.

One end of the capacitor 33 is connected to each of a signal input terminal 1b and a gate terminal of the transistor 11-2, and the other end of the capacitor 33 is connected to the other end of the resistor 31.

The phase shifter 2-3 includes a high-pass filter including a resistor 34 and a capacitor 35.

The phase shifter 2-4 includes a high-pass filter including the resistor 34 and a capacitor 36.

The resistor 34 is included in both the phase shifter 2-3 and the phase shifter 2-4.

One end of the resistor 34 is connected to each of a gate terminal of the transistor 3-1', a gate terminal of the transistor 3-4', and the other end of the capacitor 35, and the other end of the resistor 34 is connected to each of a gate terminal of the transistor 3-2', a gate terminal of the transistor 3-3', and the other end of the capacitor 36.

One end of the capacitor 35 is connected to each of a signal input terminal 1c and a gate terminal of a transistor 11-3, and the other end of the capacitor 35 is connected to one end of the resistor 34.

One end of the capacitor 36 is connected to each of a signal input terminal 1d and a gate terminal of a transistor 11-4, and the other end of the capacitor 36 is connected to the other end of the resistor 34.

When each of the phase shifters 2-1 to 2-4 includes a high-pass filter, a transfer function T of each of the phase shifters 2-1 to 2-4 is represented by the following formula (32).

$$T = \frac{\omega CR}{(\omega CR)^2 + 4}(\omega CR + 2j) \tag{32}$$

In formula (32), R represents a resistance value of each of the resistors 31 and 34, and C represents a capacitance value of each of the capacitors 32, 33, 35, and 36. j represents an imaginary number.

In addition, a voltage gain B of each of the phase shifters 2-1 to 2-4 is represented by the following formula (33), and a passage phase shift θ of each of the phase shifters 2-1 to 2-4 is represented by the following formula (34).

$$B = |T| = \frac{\omega CR}{\sqrt{(\omega CR)^2 + 4}} \tag{33}$$

$$\theta = \tan^{-1}\left(\frac{2}{\omega CR}\right) \tag{34}$$

A condition under which the passage phase shift θ is, for example, 45 degrees is represented by the following formula (35).

$$\omega CR = 2 \tag{35}$$

A pass gain when formula (35) is satisfied is $1/\sqrt{2}$, and the phase shift amount d=45 degrees is achieved.

In the phase detector illustrated in FIG. 6, each of the phase shifters 2-1 to 2-4 includes a high-pass filter including a resistor and a capacitor.

Figure 7:
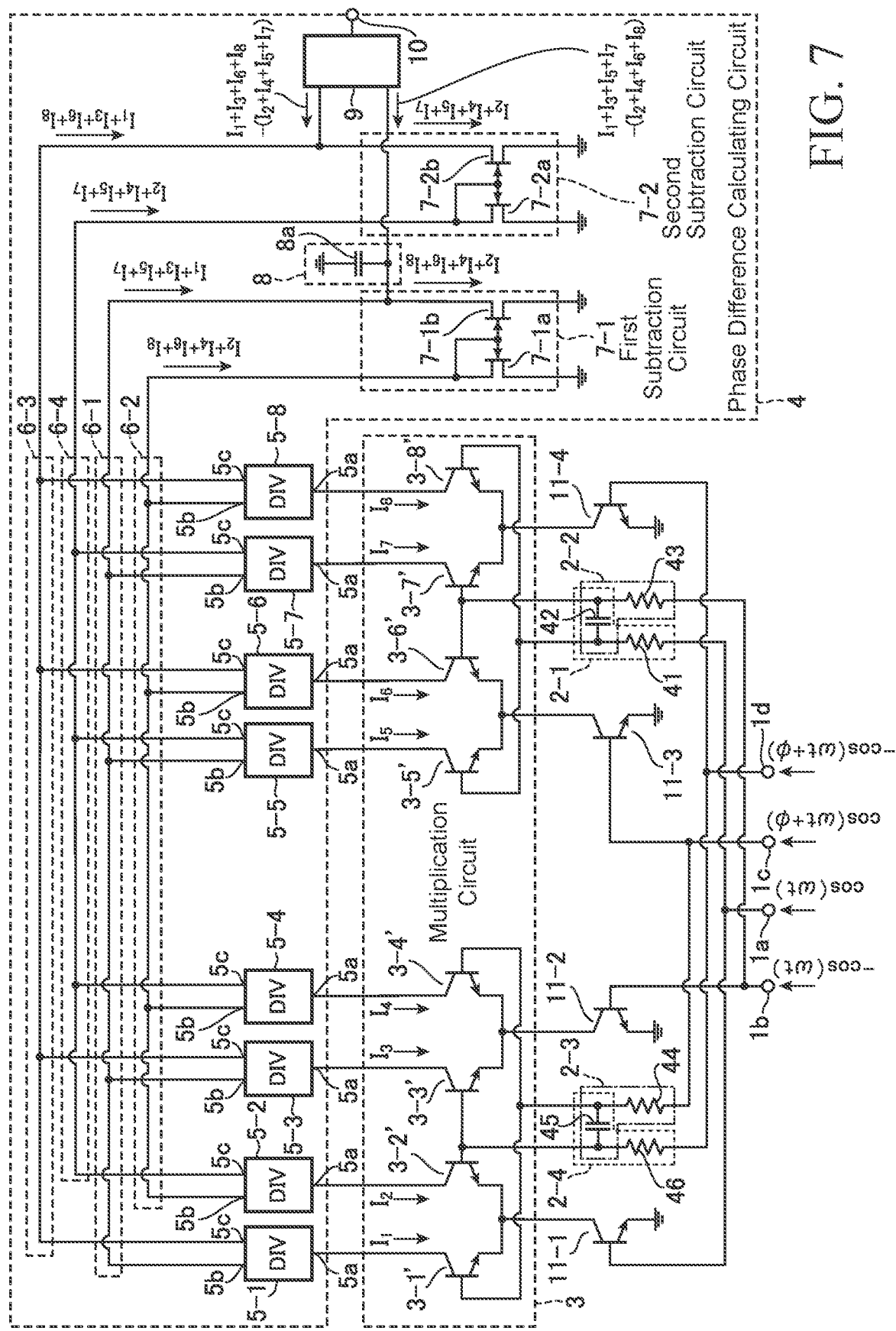
FIG. 7 is a configuration diagram illustrating another phase detector according to the third embodiment.

As illustrated in FIG. 7, a phase detector in which each of the phase shifters 2-1 to 2-4 includes a low-pass filter including a resistor and a capacitor may be used.

FIG. 7 is a configuration diagram illustrating another phase detector according to the third embodiment.

In FIG. 7, the phase shifter 2-1 includes a low-pass filter including a resistor 41 and a capacitor 42.

The phase shifter 2-2 includes a low-pass filter including a resistor 43 and the capacitor 42.

The capacitor 42 is included in both the phase shifter 2-1 and the phase shifter 2-2.

One end of the capacitor 42 is connected to each of a gate terminal of the transistor 3-5', a gate terminal of the transistor 3-8', and the other end of the resistor 41, and the other end of the capacitor 42 is connected to each of a gate terminal of the transistor 3-6', a gate terminal of the transistor 3-7', and the other end of the resistor 43.

One end of the resistor 41 is connected to each of the signal input terminal 1a and a gate terminal of the transistor 11-1, and the other end of the resistor 41 is connected to one end of the capacitor 42.

One end of the resistor 43 is connected to each of the signal input terminal 1*b* and a gate terminal of the transistor 11-2, and the other end of the resistor 43 is connected to the other end of the capacitor 42.

The phase shifter 2-3 includes a low-pass filter including a resistor 44 and a capacitor 45.

The phase shifter 2-4 includes a low-pass filter including a resistor 46 and the capacitor 45.

The capacitor 45 is included in both the phase shifter 2-3 and the phase shifter 2-4.

One end of the capacitor 42 is connected to each of a gate terminal of the transistor 3-1', ae gate terminal of the transistor 3-4', and the other end of the resistor 44, and the other end of the capacitor 42 is connected to each of a gate terminal of the transistor 3-2', a gate terminal of the transistor 3-3', and the other end of the resistor 46.

One end of the resistor 44 is connected to each of the signal input terminal 1*c* and a gate terminal of the transistor 11-3, and the other end of the resistor 44 is connected to one end of the capacitor 45.

One end of the resistor 46 is connected to each of the signal input terminal 1*d* and a gate terminal of the transistor 11-4, and the other end of the resistor 46 is connected to the other end of the capacitor 45.

A condition under which a passage phase shift θ of each of the phase shifters 2-1 to 2-4 illustrated in FIG. 7 is, for example, 45 degrees is indicated by formula (35) similarly to the condition under which the passage phase shift θ of each of the phase shifters 2-1 to 2-4 illustrated in FIG. 6 is 45 degrees.

A pass gain when formula (35) is satisfied is $1/\sqrt{2}$, and the phase shift amount d=45 degrees is achieved.

In the phase detector illustrated in FIG. 6, each of the phase shifters 2-1 to 2-4 includes a high-pass filter, and in the phase detector illustrated in FIG. 7, each of the phase shifters 2-1 to 2-4 includes a low-pass filter. However, these are merely examples, and for example, each of the phase shifters 2-1 and 2-2 may include a high-pass filter, and each of the phase shifters 2-3 and 2-4 may include a low-pass filter. In addition, for example, each of the phase shifters 2-1 and 2-2 may include a low-pass filter, and each of the phase shifters 2-3 and 2-4 may include a high-pass filter.

Fourth Embodiment

In the phase detector illustrated in FIG. 6, each of the phase shifters 2-1 to 2-4 includes a high-pass filter including a resistor and a capacitor.

In a fourth embodiment, a phase detector in which each of phase shifters 2-1 to 2-4 includes a high-pass filter including a resistor and a variable capacitor will be described.

Figure 8:
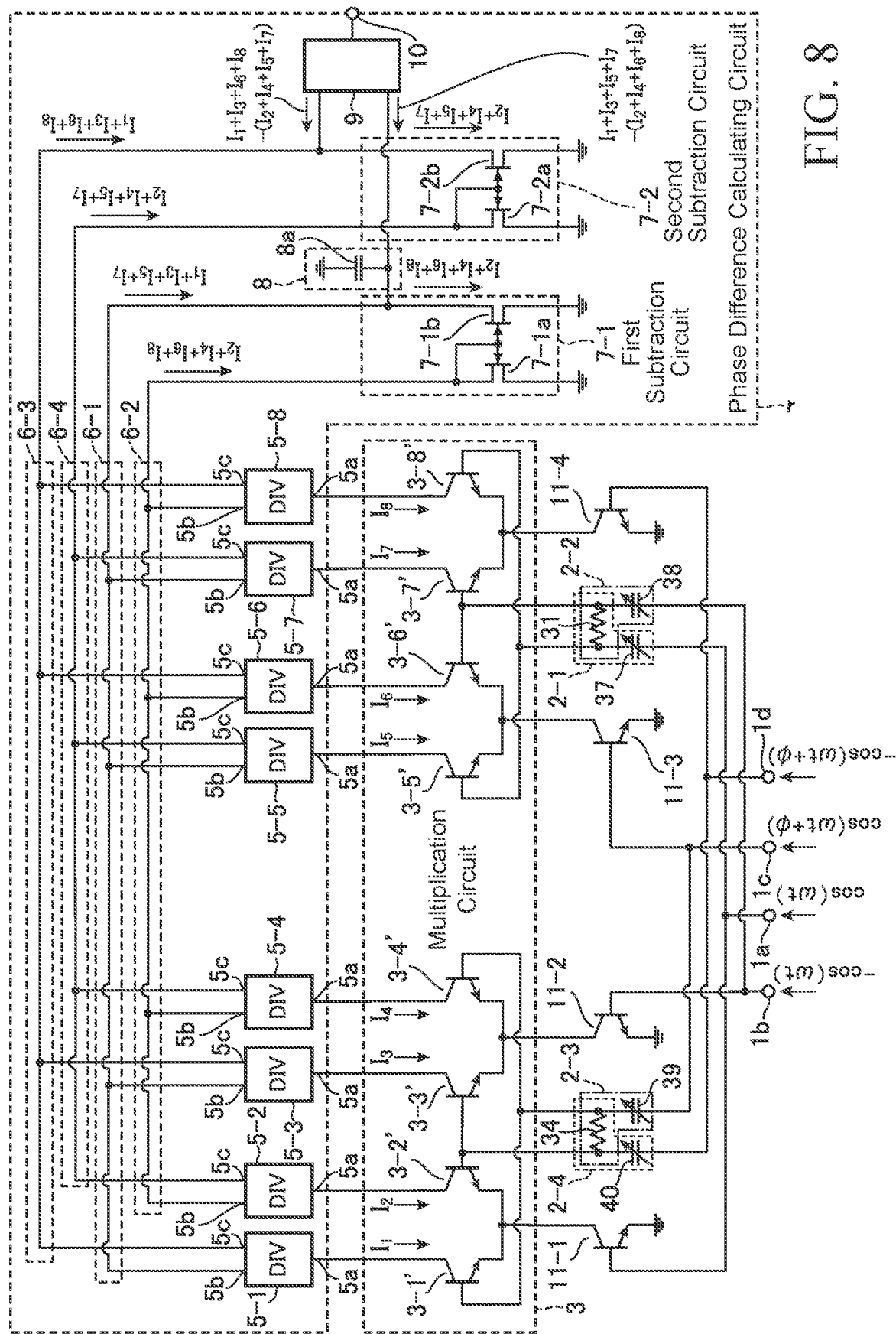
FIG. 8 is a configuration diagram illustrating a phase detector according to a fourth embodiment.

FIG. 8 is a configuration diagram illustrating the phase detector according to the fourth embodiment. In FIG. 8, the same reference numerals as in FIGS. 1, 3, and 6 indicate the same or corresponding parts, and therefore description thereof is omitted.

The phase shifter 2-1 includes a high-pass filter including a resistor 31 and a variable capacitor 37.

The phase shifter 2-2 includes a high-pass filter including the resistor 31 and a variable capacitor 38.

One end of the variable capacitor 37 is connected to each of a signal input terminal 1*a* and a gate terminal of a transistor 11-1, and the other end of the variable capacitor 37 is connected to one end of the resistor 31.

One end of the variable capacitor 38 is connected to each of a signal input terminal 1*b* and a gate terminal of a transistor 11-2, and the other end of the variable capacitor 38 is connected to the other end of the resistor 31.

The phase shifter 2-3 includes a high-pass filter including a resistor 34 and a variable capacitor 39.

The phase shifter 2-4 includes a high-pass filter including the resistor 34 and a variable capacitor 40.

One end of the variable capacitor 39 is connected to each of a signal input terminal 1*c* and a gate terminal of a transistor 11-3, and the other end of the variable capacitor 39 is connected to one end of the resistor 34.

One end of the variable capacitor 40 is connected to each of a signal input terminal 1*d* and a gate terminal of a transistor 11-4, and the other end of the variable capacitor 40 is connected to the other end of the resistor 34.

A transfer function T of each of the phase shifters 2-1 to 2-4 is represented by the above formula (32).

In addition, a voltage gain B of each of the phase shifters 2-1 to 2-4 is represented by the above formula (33), and a passage phase shift θ of each of the phase shifters 2-1 to 2-4 is represented by the above formula (34).

A condition under which the passage phase shift θ is, for example, 45 degrees is represented by the above formula (35).

A pass gain when formula (35) is satisfied is $1/\sqrt{2}$, and the phase shift amount d=45 degrees is achieved.

Even when an angular frequency co of each of a first differential signal and a second differential signal is changed, a phase shift amount d of each of the phase shifters 2-1 to 2-4 can be set to, for example, 45 degrees by adjusting a capacitance value C of each of the variable capacitors 37 to 40.

In the phase detector illustrated in FIG. 7, each of the phase shifters 2-1 to 2-4 includes a low-pass filter including a resistor and a capacitor.

Figure 9:
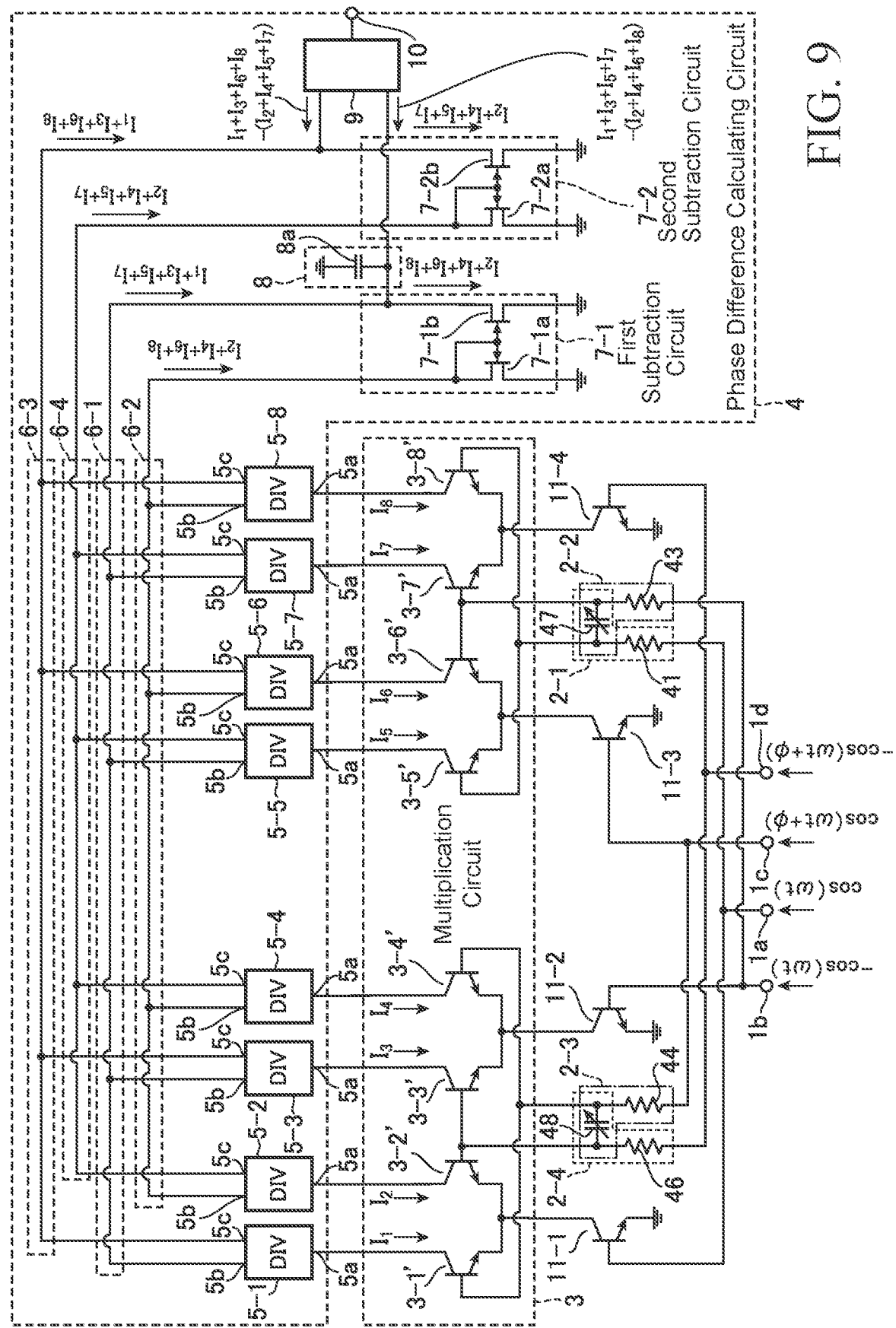
FIG. 9 is a configuration diagram illustrating another phase detector according to the fourth embodiment.

As illustrated in FIG. 9, a phase detector in which each of the phase shifters 2-1 to 2-4 includes a low-pass filter including a resistor and a variable capacitor will be described.

FIG. 9 is a configuration diagram illustrating another phase detector according to the fourth embodiment. In FIG. 9, the same reference numerals as in FIGS. 1, 3, and 7 indicate the same or corresponding parts, and therefore description thereof is omitted.

The phase shifter 2-1 includes a low-pass filter including a resistor 41 and a variable capacitor 47.

The phase shifter 2-2 includes a low-pass filter including a resistor 43 and the variable capacitor 47.

The variable capacitor 47 is included in both the phase shifter 2-1 and the phase shifter 2-2.

One end of the variable capacitor 47 is connected to each of a gate terminal of a transistor 3-5', a gate terminal of a transistor 3-8', and the other end of the resistor 41, and the other end of the variable capacitor 47 is connected to each of a gate terminal of a transistor 3-6', a gate terminal of a transistor 3-7', and the other end of the resistor 43.

The phase shifter 2-3 includes a low-pass filter including a resistor 44 and the variable capacitor 48.

The phase shifter 2-4 includes a low-pass filter including a resistor 46 and the variable capacitor 48.

The variable capacitor 48 is included in both the phase shifter 2-3 and the phase shifter 2-4.

One end of the variable capacitor 48 is connected to each of a gate terminal of a transistor 3-1', a gate terminal of a transistor 3-4', and the other end of the resistor 44, and the other end of the variable capacitor 48 is connected to each of a gate terminal of a transistor 3-2', a gate terminal of a transistor 3-3', and the other end of the resistor 46.

A condition under which a passage phase shift θ of each of the phase shifters 2-1 to 2-4 illustrated in FIG. 9 is, for example, 45 degrees is indicated by formula (35) similarly to the condition under which the passage phase shift θ of each of the phase shifters 2-1 to 2-4 illustrated in FIG. 8 is 45 degrees.

A pass gain when formula (35) is satisfied is 1/√2, and the phase shift amount d=45 degrees is achieved.

Even when an angular frequency co of each of a first differential signal and a second differential signal is changed, a phase shift amount d of each of the phase shifters 2-1 to 2-4 can be set to, for example, 45 degrees by adjusting a capacitance value C of each of the variable capacitors 47 and 48.

In the phase detector illustrated in FIG. 8, each of the phase shifters 2-1 to 2-4 includes a high-pass filter, and in the phase detector illustrated in FIG. 9, each of the phase shifters 2-1 to 2-4 includes a low-pass filter. However, these are merely examples, and for example, each of the phase shifters 2-1 and 2-2 may include a high-pass filter, and each of the phase shifters 2-3 and 2-4 may include a low-pass filter. In addition, for example, each of the phase shifters 2-1 and 2-2 may include a low-pass filter, and each of the phase shifters 2-3 and 2-4 may include a high-pass filter.

Fifth Embodiment

In a fifth embodiment, a phase detector in which each of phase shifters 2-1 and 2-2 includes a low-pass filter including a resistor and a variable capacitor, and each of phase shifters 2-3 and 2-4 includes a high-pass filter including a resistor and a variable capacitor will be described.

Figure 10:
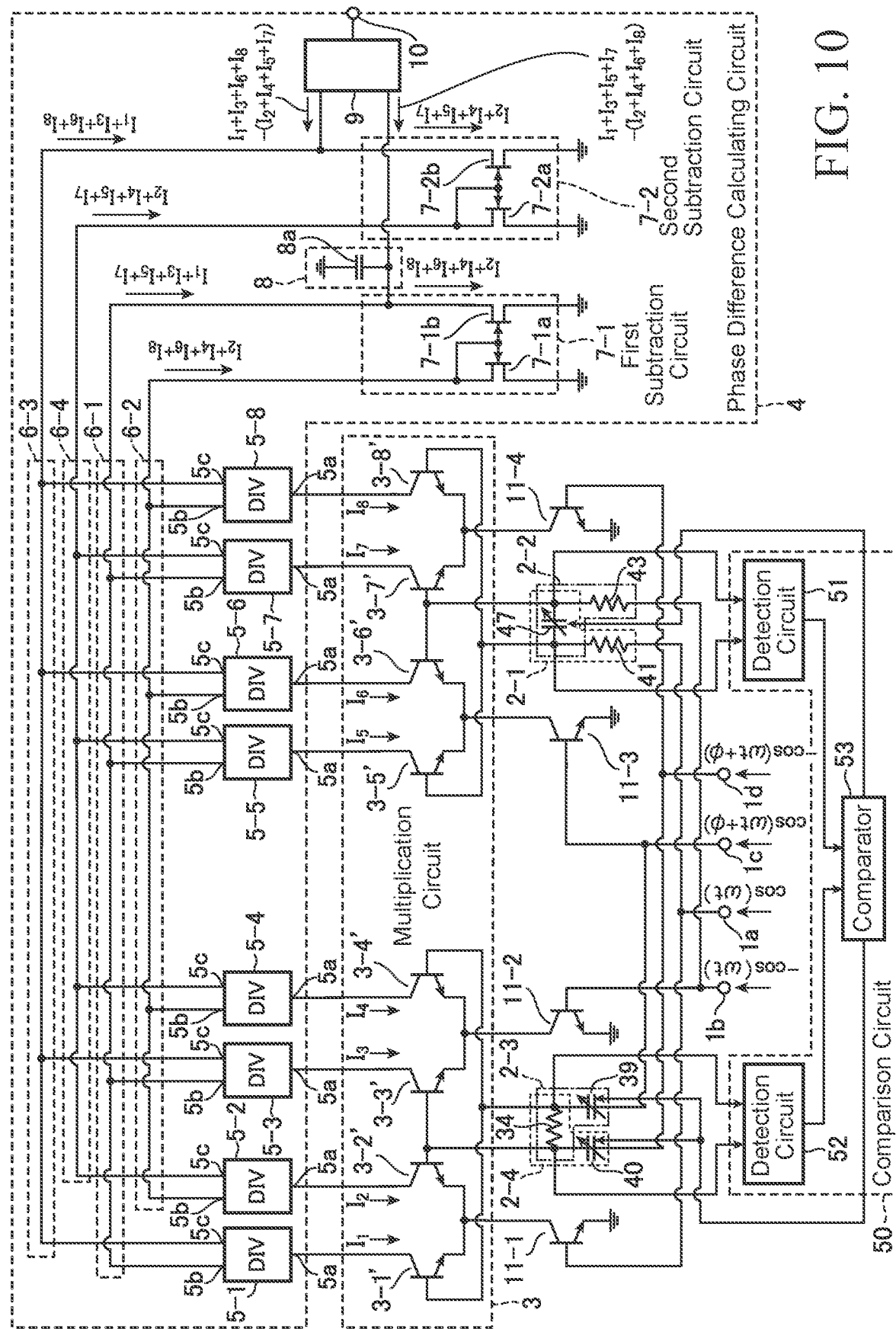
FIG. 10 is a configuration diagram illustrating a phase detector according to a fifth embodiment.

FIG. 10 is a configuration diagram illustrating the phase detector according to the fifth embodiment. In FIG. 10, the same reference numerals as in FIGS. 1, 3, 8, and 9 indicate the same or corresponding parts, and therefore description thereof is omitted.

A comparison circuit 50 includes a detection circuit 51, a detection circuit 52, and a comparator 53.

The comparison circuit 50 adjusts a capacitance value C of each of the variable capacitors 47 included in the low-pass filter and the variable capacitors 39 and 40 included in the high-pass filter on the basis of an amplitude of an output signal of the low-pass filter included in the phase shifters 2-1 and 2-2 and an amplitude of an output signal of the high-pass filter included in the phase shifters 2-3 and 2-4.

The detection circuit 51 detects an amplitude of a phase-shifted first positive-phase signal cos(ωt+d), which is an output signal of the low-pass filter included in the phase shifter 2-1, and an amplitude of a phase-shifted first negative-phase signal −cos(ωt+d), which is an output signal of the low-pass filter included in phase shifter 2-2.

The detection circuit 51 outputs, to the comparator 53, a differential amplitude between the amplitude of the phase-shifted first positive-phase signal cos(ωt+d) and the amplitude of the phase-shifted first negative-phase signal −cos(ωt+d).

The detection circuit 52 detects an amplitude of a phase-shifted second positive-phase signal cos(ωt+φ+d), which is an output signal of the high-pass filter included in phase shifter 2-3, and an amplitude of a phase-shifted second negative-phase signal −cos(ωt+φ+d), which is an output signal of the high-pass filter included in phase shifter 2-4.

The detection circuit 52 outputs, to the comparator 53, a differential amplitude between the amplitude of the phase-shifted second positive-phase signal cos(ωt+φ+d) and the amplitude of the phase-shifted second negative-phase signal −cos(ωt+φ+d).

The comparator 53 compares the differential amplitude output from the detection circuit 51 with the differential amplitude output from the detection circuit 52.

The comparator 53 adjusts a capacitance value C of each of the variable capacitor 47 included in the low-pass filter and the variable capacitors 39 and 40 included in the high-pass filter on the basis of a comparison result of the differential amplitudes.

Figure 11A:
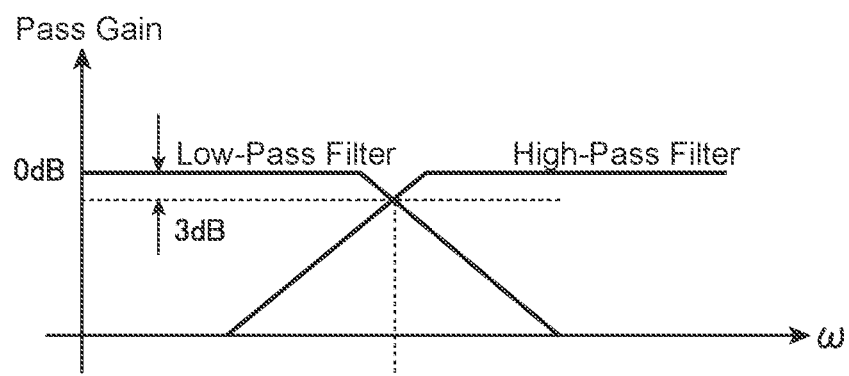
FIG. 11A is an explanatory diagram illustrating frequency characteristics of pass gain in a low-pass filter included in phase shifters 2-1 and 2-2 and a high-pass filter included in phase shifters 2-3 and 2-4.

FIG. 11A is an explanatory diagram illustrating frequency characteristics of a pass gain in the low-pass filter included in the phase shifters 2-1 and 2-2 and the high-pass filter included in the phase shifters 2-3 and 2-4.

Figure 11B:
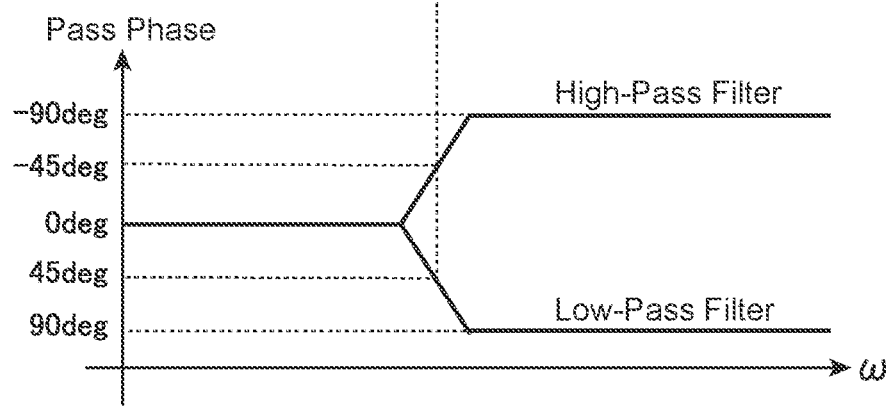
FIG. 11B is an explanatory diagram illustrating frequency characteristics of pass phase shift in the low-pass filter included in the phase shifters 2-1 and 2-2 and the high-pass filter included in the phase shifters 2-3 and 2-4.

FIG. 11B is an explanatory diagram illustrating frequency characteristics of a pass phase shift in the low-pass filter included in the phase shifters 2-1 and 2-2 and the high-pass filter included in the phase shifters 2-3 and 2-4.

As illustrated in FIG. 11B, when the pass phase shift of the low-pass filter included in the phase shifters 2-1 and 2-2 is 45 degrees and the pass phase shift of the high-pass filter included in the phase shifters 2-3 and 2-4 is −45 degrees, as illustrated in FIG. 11A, an amplitude of an output signal of the low-pass filter included in the phase shifters 2-1 and 2-2 coincides with an amplitude of an output signal of the high-pass filter included in the phase shifters 2-3 and 2-4.

At this time, since each of the pass gain of the low-pass filter included in the phase shifters 2-1 and 2-2 and the pass gain of the high-pass filter included in the phase shifters 2-3 and 2-4 is −3 (dB), a phase shift of ±45 degrees is achieved at a cutoff frequency.

Next, an operation of the phase detector illustrated in FIG. 10 will be described.

The detection circuit 51 detects an amplitude of a phase-shifted first positive-phase signal cos(ωt+d), which is an output signal of the low-pass filter included in the phase shifter 2-1.

The detection circuit 51 detects an amplitude of a phase-shifted first negative-phase signal −cos(ωt+d), which is an output signal of the low-pass filter included in the phase shifter 2-2.

The detection circuit 51 outputs, to the comparator 53, a differential amplitude between the amplitude of the phase-shifted first positive-phase signal cos(ωt+d) and the amplitude of the phase-shifted first negative-phase signal −cos(ωt+d).

The detection circuit 52 detects an amplitude of a phase-shifted second positive-phase signal cos(ωt+φ+d), which is an output signal of the high-pass filter included in the phase shifter 2-3.

The detection circuit 52 detects an amplitude of a phase-shifted second negative-phase signal −cos(ωt+φ+d), which is an output signal of the high-pass filter included in the phase shifter 2-4.

The detection circuit 52 outputs, to the comparator 53, a differential amplitude between the amplitude of the phase-shifted second positive-phase signal cos(ωt+φ+d) and the amplitude of the phase-shifted second negative-phase signal −cos(ωt+φ+d).

The comparator 53 compares the differential amplitude output from the detection circuit 51 with the differential amplitude output from the detection circuit 52.

The comparator 53 adjusts a capacitance value C of each of the variable capacitor 47, the variable capacitor 39, and the variable capacitor 40 in such a manner that the differential amplitude output from detection circuit 51 coincides with the differential amplitude output from detection circuit 52.

When the differential amplitude output from detection circuit 51 coincides with the differential amplitude output from detection circuit 52, a phase shift amount d in each of phase shifters 2-1 to 2-4 is 45 degrees.

In the phase detector illustrated in FIG. 10, the comparator 53 adjusts a capacitance value C of each of the variable capacitor 47, the variable capacitor 39, and the variable capacitor 40 in such a manner that the differential amplitude output from detection circuit 51 coincides with the differential amplitude output from detection circuit 52. However, coincidence of the differential amplitudes is not limited to exact coincidence, and the differential amplitudes may be different from each other in a range in which there is no practical problem.

In the phase detector illustrated in FIG. 10, each of the phase shifters 2-1 and 2-2 includes a low-pass filter, and each of the phase shifters 2-3 and 2-4 includes a high-pass filter. However, this is merely an example, and as illustrated in FIG. 12, each of the phase shifters 2-1 to 2-2 may include a high-pass filter, and each of the phase shifters 2-3 to 2-4 may include a low-pass filter.

Figure 12:
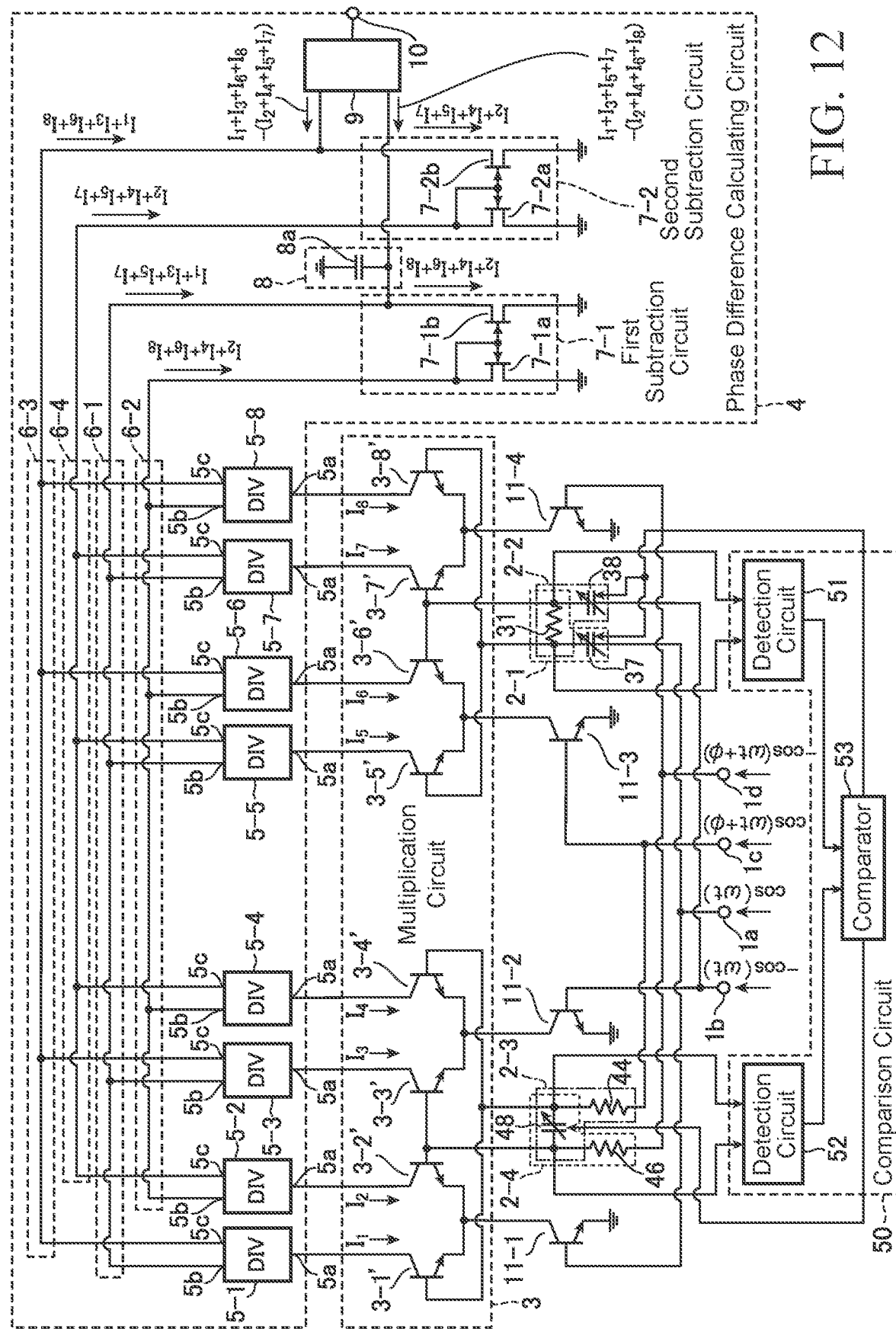
FIG. 12 is a configuration diagram illustrating another phase detector according to the fifth embodiment.

FIG. 12 is a configuration diagram illustrating another phase detector according to the fifth embodiment.

When each of the phase shifters 2-1 and 2-2 includes a high-pass filter and each of the phase shifters 2-3 and 2-4 includes a low-pass filter, the comparator 53 adjusts a capacitance value C of each of the variable capacitor 37, the variable capacitor 38, and the variable capacitor 48 in such a manner that the differential amplitude output from the detection circuit 51 coincides with the differential amplitude output from the detection circuit 52.

Sixth Embodiment

In the phase detector illustrated in FIG. 1, the phase difference calculating circuit 4 includes the first addition circuit 6-1, the second addition circuit 6-2, the third addition circuit 6-3, and the fourth addition circuit 6-4.

In a sixth embodiment, a phase detector in which a phase difference calculating circuit 4 includes a first difference circuit 60-1, a second difference circuit 60-2, a third difference circuit 60-3, and a fourth difference circuit 60-4 will be described.

FIG. 13 is a configuration diagram illustrating the phase detector according to the sixth embodiment. In FIG. 13, the same reference numerals as in FIG. 1 indicate the same or corresponding parts, and therefore description thereof is omitted.

The phase difference calculating circuit 4 includes two-way dividers 5-1 to 5-8, the first difference circuit 60-1, the second difference circuit 60-2, the third difference circuit 60-3, the fourth difference circuit 60-4, a first subtraction circuit 61-1, a second subtraction circuit 61-2, a filter 62, a calculation processing circuit 63, and a signal output terminal 10.

In FIG. 13, each of the first difference circuit 60-1, the second difference circuit 60-2, the third difference circuit 60-3, and the fourth difference circuit 60-4 is represented by "−".

The first difference circuit 60-1 subtracts a sum of a fifth multiplication signal $\cos(\omega t+d)\times\cos(\omega t+\varphi)$ output from the two-way divider 5-5 and a seventh multiplication signal $\cos(\omega t+d)\times\cos(\omega t+\varphi)$ output from the two-way divider 5-7 from a sum of a first multiplication signal $\cos(\omega t)\times\cos(\omega t+\varphi+d)$ output from the two-way divider 5-1 and a third multiplication signal $\cos(\omega t)\times\cos(\omega t+\varphi+d)$ output from the two-way divider 5-3.

The first difference circuit 60-1 outputs a first difference signal $-4\cdot\sin(\omega)\sin(d)$ indicating a result of the subtraction to the first subtraction circuit 61-1.

The second difference circuit 60-2 subtracts a sum of a sixth multiplication signal $-\cos(\omega t+d)\times\cos(\omega t+\varphi)$ output from the two-way divider 5-6 and an eighth multiplication signal $-\cos(\omega t+d)\times\cos(\omega t+\varphi)$ output from the two-way divider 5-8 from a sum of a second multiplication signal $-\cos(\omega t)\times\cos(\omega t+\varphi+d)$ output from the two-way divider 5-2 and a fourth multiplication signal $-\cos(\omega t)\times\cos(\omega t+\varphi+d)$ output from the two-way divider 5-4.

The second difference circuit 60-2 outputs a second difference signal $4\cdot\sin(\varphi)\sin(d)$ indicating a result of the subtraction to the first subtraction circuit 61-1.

The third difference circuit 60-3 subtracts a sum of the sixth multiplication signal $-\cos(\omega t+d)\times\cos(\omega t+\varphi)$ output from the two-way divider 5-6 and the eighth multiplication signal $-\cos(\omega t+d)\times\cos(\omega t+\varphi)$ output from the two-way divider 5-8 from a sum of the first multiplication signal $\cos(\omega t)\times\cos(\omega t+\varphi+d)$ output from the two-way divider 5-1 and the third multiplication signal $\cos(\omega t)\times\cos(\omega t+\varphi+d)$ output from the two-way divider 5-3.

The third difference circuit 60-3 outputs a third difference signal $2\cdot(\cos(2\omega t+\varphi+d)+\cos(\omega+d)+\cos(\omega-d))$ indicating a result of the subtraction to the second subtraction circuit 61-2.

The fourth difference circuit 60-4 subtracts a sum of the fifth multiplication signal $\cos(\omega t+d)\times\cos(\omega t+\varphi)$ output from the two-way divider 5-5 and the seventh multiplication signal $\cos(\omega t+d)\times\cos(\omega t+\varphi)$ output from the two-way divider 5-7 from a sum of the second multiplication signal $-\cos(\omega t)\times\cos(\omega t+\varphi+d)$ output from the two-way divider 5-2 and the fourth multiplication signal $-\cos(\omega t)\times\cos(\omega t+\varphi+d)$ output from the two-way divider 5-4.

The fourth difference circuit 60-4 outputs a fourth difference signal $-2\cdot(\cos(2\omega t+\varphi+d)+\cos(\omega+d)+\cos(\omega-d))$ indicating a result of the subtraction to the second subtraction circuit 61-2.

The first subtraction circuit 61-1 subtracts the second difference signal $4\cdot\sin(\omega)\sin(d)$ output from the second difference circuit 60-2 from the first difference signal $-4\cdot\sin(\omega)\sin(d)$ output from the first difference circuit 60-1.

The first subtraction circuit 61-1 outputs a first subtraction signal $-8\cdot\sin(\omega)\sin(d)$ indicating a result of the subtraction to the calculation processing circuit 63.

The second subtraction circuit 61-2 subtracts the third difference signal $2\cdot(\cos(2\omega t+\varphi+d)+\cos(\omega+d)+\cos(\omega-d))$ output from the third difference circuit 60-3 from the fourth difference signal $-2\cdot(\cos(2\omega t+\varphi+d)+\cos(\omega+d)+\cos(\omega-d))$ output from the fourth difference circuit 60-4.

The second subtraction circuit 61-2 outputs a second subtraction signal $-4\cdot\cos(2\omega t+\varphi+d)$ indicating a result of the subtraction to the filter 62.

The filter 62 is implemented by, for example, LPF or BPF.

The filter 62 removes a high-frequency component included in the second subtraction signal $-4\cdot\cos(2\omega t+\varphi+d)$ output from the second subtraction circuit 61-2.

The filter 62 outputs the second subtraction signal $-8\cdot\cos(\omega)\cos(d)$ after removal of the high-frequency component to the calculation processing circuit 63.

The calculation processing circuit 63 calculates a phase difference φ between a first differential signal and a second differential signal from the first subtraction signal $-8\cdot\sin(\omega)\sin(d)$ output from the first subtraction circuit 61-1 and the second subtraction signal −8·cos(ω)cos(d) after removal of the high-frequency component output from the filter 62.

The calculation processing circuit 63 outputs the calculated phase difference φ to the signal output terminal 10.

Next, an operation of the phase detector illustrated in FIG. 13 will be described.

The operation of the phase detector illustrated in FIG. 13 is similar to the operation of the phase detector illustrated in FIG. 1 except for the first difference circuit 60-1, the second difference circuit 60-2, the third difference circuit 60-3, the fourth difference circuit 60-4, the first subtraction circuit 61-1, the second subtraction circuit 61-2, the filter 62, and the calculation processing circuit 63. Therefore, only operations of the first difference circuit 60-1, the second difference circuit 60-2, the third difference circuit 60-3, the fourth difference circuit 60-4, the first subtraction circuit 61-1, the second subtraction circuit 61-2, the filter 62, and the calculation processing circuit 63 will be described here.

To the first difference circuit 60-1, the first multiplication signal cos(ωt)×cos (ωt+φ+d) output from the two-way divider 5-1 and the third multiplication signal cos (ωt)×cos (ωt+φ+d) output from the two-way divider 5-3 are input. In addition, to the first difference circuit 60-1, the fifth multiplication signal cos(ωt+d)×cos(ωt+φ) output from the two-way divider 5-5 and the seventh multiplication signal cos (ωt+d)×cos(ωt+φ) output from the two-way divider 5-7 are input.

The first difference circuit 60-1 subtracts a sum of the fifth multiplication signal cos(ωt+d)×cos(ωt+φ) and the seventh multiplication signal cos(ωt+d)×cos(ωt+φ) from a sum of the first multiplication signal cos(ωt)×cos(ωt+φ+d) and the third multiplication signal cos(ωt)×cos(ωt+φ+d).

The first difference circuit 60-1 outputs a first difference signal −4·sin(ω)sin (d) indicating a result of the subtraction to the first subtraction circuit 61-1.

To the second difference circuit 60-2, the second multiplication signal −cos(ωt)×cos(ωt+φ+d) output from the two-way divider 5-2 and the fourth multiplication signal −cos (ωt)×cos(ωt+φ+d) output from the two-way divider 5-4 are input. In addition, to the second difference circuit 60-2, the sixth multiplication signal −cos(ωt+d)×cos(ωt+φ) output from the two-way divider 5-6 and the eighth multiplication signal −cos(ωt+d)×cos(ωt+φ) output from the two-way divider 5-8 are input.

The second difference circuit 60-2 subtracts a sum of the sixth multiplication signal −cos(ωt+d)×cos(ωt+φ) and the eighth multiplication signal −cos(ωt+d)×cos(ωt+φ) from a sum of the second multiplication signal −cos(ωt)×cos(ωt+φ+d) and the fourth multiplication signal −cos(ωt)×cos(ωt+φ+d).

The second difference circuit 60-2 outputs a second difference signal 4·sin(φ) sin(d) indicating a result of the subtraction to the first subtraction circuit 61-1.

To the third difference circuit 60-3, the first multiplication signal cos(ωt)×cos (ωt+φ+d) output from the two-way divider 5-1 and the third multiplication signal cos (ωt)×cos (ωt+φ+d) output from the two-way divider 5-3 are input. In addition, to the third difference circuit 60-3, the sixth multiplication signal −cos(ωt+d)×cos(ωt+φ) output from the two-way divider 5-6 and the eighth multiplication signal −cos(ωt+d)×cos(ωt+φ) output from the two-way divider 5-8 are input.

The third difference circuit 60-3 subtracts a sum of the sixth multiplication signal −cos(ωt+d)×cos(ωt+φ) and the eighth multiplication signal −cos(ωt+d)×cos(ωt+φ) from a sum of the first multiplication signal cos(ωt)×cos(ωt+φ+d) and the third multiplication signal cos(ωt)×cos(ωt+φ+d).

The third difference circuit 60-3 outputs a third difference signal 2·(cos(2ωt+φ+d)+cos(φ+d)+cos(φ−d)) indicating a result of the subtraction to the second subtraction circuit 61-2.

To the fourth difference circuit 60-4, the second multiplication signal −cos(ωt)×cos(ωt+φ+d) output from the two-way divider 5-2 and the fourth multiplication signal −cos (ωt)×cos(ωt+φ+d) output from the two-way divider 5-4 are input. In addition, to the fourth difference circuit 60-4, the fifth multiplication signal cos(ωt+d)×cos(ωt+φ) output from the two-way divider 5-5 and the seventh multiplication signal cos(ωt+d)×cos(ωt+φ) output from the two-way divider 5-7 are input.

The fourth difference circuit 60-4 subtracts a sum of the fifth multiplication signal cos(ωt+d)×cos(ωt+φ) and the seventh multiplication signal cos(ωt+d)×cos(ωt+φ) from a sum of the second multiplication signal −cos(ωt)×cos(ωt+φ+d) and the fourth multiplication signal −cos(ωt)×cos(ωt+φ+d).

The fourth difference circuit 60-4 outputs a fourth difference signal −2·(cos (2ωt+φ+d)+cos(φ+d)+cos(φ−d)) indicating a result of the subtraction to the second subtraction circuit 61-2.

To the first subtraction circuit 61-1, the first difference signal −4·sin(ω)sin(d) output from first difference circuit 60-1 and the second difference signal 4·sin(ω)sin (d) output from second difference circuit 60-2 are input.

The first subtraction circuit 61-1 subtracts the second difference signal 4·sin (ω)sin(d) output from the second difference circuit 60-2 from the first difference signal −4·sin (ω)sin(d).

The first subtraction circuit 61-1 outputs a first subtraction signal −8·sin(ω)sin (d) indicating a result of the subtraction to the calculation processing circuit 63.

To the second subtraction circuit 61-2, the fourth difference signal −2·(cos(2ωt+φ+d)+cos(ω+d)+cos(ω−d)) output from the fourth difference circuit 60-4 and the third difference signal 2·(cos(2ωt+φ+d)+cos(ω+d)+cos(ω−d)) output from the third difference circuit 60-3 are input.

The second subtraction circuit 61-2 subtracts the third difference signal 2·(cos (2ωt+φ+d)+cos(ω+d)+cos(ω−d)) from the fourth difference signal −2·(cos(2ωt+φ+d)+cos(ω+d)+cos(ω−d)).

The second subtraction circuit 61-2 outputs a second subtraction signal −4·cos (2ωt+φ+d) indicating a result of the subtraction to the filter 62.

When receiving the second subtraction signal −4·cos (2ωt+φ+d) from the second subtraction circuit 61-2, the filter 62 removes a high-frequency component included in the second subtraction signal −4·cos(2ωt+φ+d).

The filter 62 outputs the second subtraction signal −8·cos (ω)cos(d) after removal of the high-frequency component to the calculation processing circuit 63.

To the calculation processing circuit 63, the first subtraction signal −8·sin(φ) sin(d) output from the first subtraction circuit 61-1 and the second subtraction signal −8·cos(ω)cos (d) after removal of the high-frequency component output from the filter 62 are input.

The calculation processing circuit 63 calculates a phase difference φ between a first differential signal and a second differential signal from the first subtraction signal −8·sin(ω) sin(d) and the second subtraction signal −8·cos(ω)cos(d) after removal of the high-frequency component as indicated in the following formula (36).

$$\hat{\varphi} = \tan^{-1}\left(\frac{-8 \cdot \sin(\hat{\varphi})\sin(d)}{-8 \cdot \cos(\hat{\varphi})\cos(d)} \times \frac{\cos(d)}{\sin(d)}\right) \quad (36)$$

Since the phase shift amount d of the phase shift circuit 2 is a predetermined value, each of cos(d) and sin(d) is also a predetermined value. For example, each of cos(d) and sin(d) may be stored in an internal memory of the calculation processing circuit 63, or may be provided from the outside of the phase detector illustrated in FIG. 13.

The calculation processing circuit 63 outputs the calculated phase difference φ to the signal output terminal 10.

In the calculation formula of a phase difference φ indicated in formula (36), with a phase shift amount d in which cos(d) or sin(d) is not zero, the phase difference φ between a first differential signal and a second differential signal can be calculated. The phase shift amount d in which cos(d) or sin(d) is not zero is a phase shift amount other than 0 degrees, 90 degrees, 180 degrees, or 270 degrees.

Therefore, in the phase detector illustrated in FIG. 13, a range in which the phase difference φ can be detected is not limited to a range of 180 degrees.

Note that the present invention can freely combine the embodiments to one another, modify any component in each of the embodiments, or omit any component in each of the embodiments within the scope of the invention.

INDUSTRIAL APPLICABILITY

The present invention is suitable for a phase detector that calculates a phase difference between a first differential signal and a second differential signal.

REFERENCE SIGNS LIST

1a: signal input terminal, 1b: signal input terminal, 1c: signal input terminal, 1d: signal input terminal, 2: phase shift circuit, 2-1 to 2-4: phase shifter, 2-1a, 2-2a, 2-3a, 2-4a, 2-5a, 2-6a, 2-7a, and 2-8a: input terminal, 2-1b, 2-2b, 2-3b, 2-4b, 2-5b, 2-6b, 2-7b, and 2-8b: output terminal, 3: multiplication circuit, 3-1: first multiplier, 3-2: second multiplier, 3-3: third multiplier, 3-4: fourth multiplier, 3-5: fifth multiplier, 3-6: sixth multiplier, 3-7: seventh multiplier, 3-8: eighth multiplier, 3-1a, 3-1b, 3-2a, 3-2b, 3-3a, 3-3b, 3-4a, 3-4b, 3-5a, 3-5b, 3-6a, 3-6b, 3-7a, 3-7b, 3-8a, and 3-8b: input terminal, 3-1c, 3-2c, 3-3c, 3-4c, 3-5c, 3-6c, 3-7c, and 3-8c: output terminal, 3-1' to 3-8': transistor, 4: phase difference calculating circuit, 5-1 to 5-8: two-way divider, 5a, 5b, and 5c: terminal, 5d, 5e, and 5f: transistor, 6-1: first addition circuit, 6-2: second addition circuit, 6-3: third addition circuit, 6-4: fourth addition circuit, 7-1: first subtraction circuit, 7-1a and 7-1b: transistor, 7-2: second subtraction circuit, 7-2a and 7-2b: transistor, 8: filter, 8a: capacitor, 9: calculation processing circuit, 10: signal output terminal, 11-1 to 11-4: transistor, 20: input terminal, 21: resistor, 22: capacitor, 23: output terminal, 31: resistor, 32 and 33: capacitor, 34: resistor, 35 and 36: capacitor, 37 to 40: variable capacitor, 41 and 43: resistor, 42: capacitor, 44 and 46: resistor, 45: capacitor, 50: comparison circuit, 51: detection circuit, 52: detection circuit, 53: comparator, 60-1: first difference circuit, 60-2: second difference circuit, 60-3: third difference circuit, 60-4: fourth difference circuit, 61-1: first subtraction circuit, 61-2: second subtraction circuit, 62: filter, and 63: calculation processing circuit

The invention claimed is:

1. A phase detector comprising:
a phase shift circuit to phase-shift each of a first positive-phase signal included in a first differential signal and a first negative-phase signal included in the first differential signal, and phase-shift each of a second positive-phase signal included in a second differential signal and a second negative-phase signal included in the second differential signal;
a multiplication circuit to perform multiplication of two signals for all combinations of the first positive-phase signal included in the first differential signal and the first negative-phase signal included in the first differential signal with the second positive-phase signal phase-shifted by the phase shift circuit and the second negative-phase signal phase-shifted by the phase shift circuit, output a multiplication signal indicating a result of the multiplication, perform multiplication of two signals for all combinations of the first positive-phase signal phase-shifted by the phase shift circuit and the first negative-phase signal phase-shifted by the phase shift circuit with the second positive-phase signal included in the second differential signal and the second negative-phase signal included in the second differential signal, and output a multiplication signal indicating a result of the multiplication; and
a phase difference calculating circuit to calculate a phase difference between the first differential signal and the second differential signal using all the multiplication signals output from the multiplication circuit.

2. The phase detector according to claim 1, wherein the multiplication circuit includes:
a first multiplier to multiply the first positive-phase signal included in the first differential signal by the second positive-phase signal phase-shifted by the phase shift circuit, and output a first multiplication signal indicating a result of the multiplication to the phase difference calculating circuit;
a second multiplier to multiply the first positive-phase signal included in the first differential signal by the second negative-phase signal phase-shifted by the phase shift circuit, and output a second multiplication signal indicating a result of the multiplication to the phase difference calculating circuit;
a third multiplier to multiply the first negative-phase signal included in the first differential signal by the second negative-phase signal phase-shifted by the phase shift circuit, and output a third multiplication signal indicating a result of the multiplication to the phase difference calculating circuit;
a fourth multiplier to multiply the first negative-phase signal included in the first differential signal by the second positive-phase signal phase-shifted by the phase shift circuit, and output a fourth multiplication signal indicating a result of the multiplication to the phase difference calculating circuit; and
a fifth multiplier to multiply the first positive-phase signal phase-shifted by the phase shift circuit by the second positive-phase signal included in the second differential signal, and output a fifth multiplication signal indicating a result of the multiplication to the phase difference calculating circuit;
a sixth multiplier to multiply the first negative-phase signal phase-shifted by the phase shift circuit by the second positive-phase signal included in the second differential signal, and output a sixth multiplication signal indicating a result of the multiplication to the phase difference calculating circuit;
a seventh multiplier to multiply the first negative-phase signal phase-shifted by the phase shift circuit by the second negative-phase signal included in the second differential signal, and output a seventh multiplication signal indicating a result of the multiplication to the phase difference calculating circuit; and an eighth multiplier to multiply the first positive-phase signal phase-shifted by the phase shift circuit by the second negative-phase signal included in the second differential signal, and output an eighth multiplication signal indicating a result of the multiplication to the phase difference calculating circuit.

3. The phase detector according to claim 2, wherein the phase difference calculating circuit includes:

a first addition circuit to add the first multiplication signal, the third multiplication signal, the fifth multiplication signal, and the seventh multiplication signal, and output a first addition signal indicating a result of the addition;

a second addition circuit to add the second multiplication signal, the fourth multiplication signal, the sixth multiplication signal, and the eighth multiplication signal, and output a second addition signal indicating a result of the addition;

a third addition circuit to add the first multiplication signal, the third multiplication signal, the sixth multiplication signal, and the eighth multiplication signal, and output a third addition signal indicating a result of the addition;

a fourth addition circuit to add the second multiplication signal, the fourth multiplication signal, the fifth multiplication signal, and the seventh multiplication signal, and output a fourth addition signal indicating a result of the addition;

a first subtraction circuit to subtract the second addition signal from the first addition signal, and output a first subtraction signal indicating a result of the subtraction;

a second subtraction circuit to subtract the third addition signal from the fourth addition signal, and output a second subtraction signal indicating a result of the subtraction;

a filter to remove a high-frequency component included in the first subtraction signal, and output the first subtraction signal after removal of the high-frequency component; and a calculation processing circuit to calculate a phase difference between the first differential signal and the second differential signal from the first subtraction signal after removal of the high-frequency component output from the filter and the second subtraction signal output from the second subtraction circuit.

4. The phase detector according to claim 2, wherein each of the first multiplier, the second multiplier, the third multiplier, the fourth multiplier, the fifth multiplier, the sixth multiplier, the seventh multiplier, and the eighth multiplier is a nonlinear element.

5. The phase detector according to claim 2, wherein the phase difference calculating circuit includes:

a first difference circuit to subtract a sum of the fifth multiplication signal and the seventh multiplication signal from a sum of the first multiplication signal and the third multiplication signal, and output a first difference signal indicating a result of the subtraction;

a second difference circuit to subtract a sum of the sixth multiplication signal and the eighth multiplication signal from a sum of the second multiplication signal and the fourth multiplication signal, and output a second difference signal indicating a result of the subtraction;

a third difference circuit to subtract a sum of the sixth multiplication signal and the eighth multiplication signal from a sum of the first multiplication signal and the third multiplication signal, and output a third difference signal indicating a result of the subtraction;

a fourth difference circuit to subtract a sum of the fifth multiplication signal and the seventh multiplication signal from a sum of the second multiplication signal and the fourth multiplication signal, and output a fourth difference signal indicating a result of the subtraction;

a first subtraction circuit to subtract the second difference signal from the first difference signal, and output a first subtraction signal indicating a result of the subtraction;

a second subtraction circuit to subtract the third difference signal from the fourth difference signal, and output a second subtraction signal indicating a result of the subtraction;

a filter to remove a high-frequency component included in the second subtraction signal, and output the second subtraction signal after removal of the high-frequency component; and a calculation processing circuit to calculate a phase difference between the first differential signal and the second differential signal from the first subtraction signal output from the first subtraction circuit and the second subtraction signal after removal of the high-frequency component output from the filter.

6. The phase detector according to claim 1, wherein the phase shift circuit phase-shifts each of the first positive-phase signal included in the first differential signal and the first negative-phase signal included in the first differential signal by 45 degrees, and phase-shifts each of the second positive-phase signal included in the second differential signal and the second negative-phase signal included in the second differential signal by 45 degrees.

7. The phase detector according to claim 1, wherein the phase shift circuit includes a high-pass filter including a resistor and a capacitor, or a low-pass filter including a resistor and a capacitor.

8. The phase detector according to claim 1, wherein the phase shift circuit includes a high-pass filter including a resistor and a variable capacitor, or a low-pass filter including a resistor and a variable capacitor.

9. The phase detector according to claim 1, wherein among the phase shift circuits, each of a circuit to phase-shift the first positive-phase signal included in the first differential signal and a circuit to phase-shift the first negative-phase signal included in the first differential signal includes a low-pass filter including a resistor and a variable capacitor, and among the phase shift circuits, each of a circuit to phase-shift the second positive-phase signal included in the second differential signal and a circuit to phase-shift the second negative-phase signal included in the second differential signal includes a high-pass filter including a resistor and a variable capacitor, and the phase detector further comprises a comparison circuit to adjust a capacitance value of each of the variable capacitor included in each of the low-pass filters and the variable capacitor included in each of the high-pass filters on a basis of an amplitude of an output signal of each of the low-pass filters and an amplitude of an output signal of each of the high-pass filters.

10. The phase detector according to claim 1, wherein among the phase shift circuits, each of a circuit to phase-shift the first positive-phase signal included in the first differential signal and a circuit to phase-shift the first negative-phase signal included in the first differential signal includes a high-pass filter including a resistor and a variable capacitor, and among the phase shift circuits, each of a circuit to phase-shift the second positive-phase signal included in the second differential signal and a circuit to phase-shift the second negative-phase signal included in the second differential signal includes a low-pass filter including a resistor and a variable capacitor, and the phase detector further comprises a comparison circuit to adjust a capacitance value of each of the variable capacitor included in each of the high-pass filters and the variable capacitor included in each of the low-pass filters on a basis of an amplitude of an output signal of each of the high-pass filters and an amplitude of an output signal of each of the low-pass filters.

* * * * *